(12) United States Patent
Lee

(10) Patent No.: US 10,629,653 B2
(45) Date of Patent: Apr. 21, 2020

(54) CROSS-POINT ARRAY DEVICE INCLUDING CONDUCTIVE FUSE MATERIAL LAYER

(71) Applicant: SK hynix Inc., Icheon (KR)

(72) Inventor: Jaeyeon Lee, Gunpo (KR)

(73) Assignee: SK hynix Inc., Icheon (KR)

( * ) Notice: Subject to any disclaimer, the term of this patent is extended or adjusted under 35 U.S.C. 154(b) by 0 days.

(21) Appl. No.: 16/399,856

(22) Filed: Apr. 30, 2019

(65) Prior Publication Data

US 2019/0259814 A1 Aug. 22, 2019

Related U.S. Application Data

(63) Continuation-in-part of application No. 15/824,952, filed on Nov. 28, 2017, now abandoned.

(30) Foreign Application Priority Data

Jan. 25, 2017 (KR) ........................ 10-2017-0012325

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/1253* (2013.01); *H01L 45/141* (2013.01)

(58) Field of Classification Search
CPC ............. H01L 45/1233; H01L 45/1253; H01L 27/2409; H01L 27/2427
See application file for complete search history.

(56) References Cited

U.S. PATENT DOCUMENTS

| 6,646,912 B2 | 11/2003 | Hurst et al. | |
|---|---|---|---|
| 6,982,901 B1 * | 1/2006 | Bloomquist | ............ G11C 11/16 365/158 |
| 7,499,315 B2 * | 3/2009 | Lowrey | .............. G11C 13/0004 365/148 |
| 8,576,654 B2 * | 11/2013 | Shin | ....................... G11C 13/00 365/100 |
| 8,605,495 B2 | 12/2013 | Lung | |
| 8,633,566 B2 * | 1/2014 | Sills | .................... H01L 23/5256 257/364 |

\* cited by examiner

*Primary Examiner* — Allison Bernstein

(57) ABSTRACT

In an embodiment, a cross-point array device includes a pillar-shaped structure disposed in an intersection region where a first conductive line overlaps a second conductive line. The pillar-shaped structure includes a resistance change material layer disposed between the first conductive line and the second conductive line. The pillar-shaped structure includes one or more conductive fuse material layers, each of which is disposed between the first or second conductive line and the resistance change material layer. The melting point of the conductive fuse material layer is higher than the melting point of the resistance change material layer.

19 Claims, 30 Drawing Sheets

CROSS-POINT ARRAY DEVICE INCLUDING CONDUCTIVE FUSE MATERIAL LAYER

CROSS-REFERENCE TO RELATED APPLICATION

The present application is a continuation-in-part of U.S. patent application Ser. No. 15/824,952, filed on Nov. 28, 2017, which claims priority under 35 U.S.C. 119(a) to Korean Patent Application No. 10-2017-0012325, filed on Jan. 25, 2017. These applications are each incorporated by reference.

BACKGROUND

1. Technical Field

Various embodiments of the present disclosure generally relate to a cross-point array device, and more particularly, to a cross-point array device including a conductive fuse material layer.

2. Related Art

A cross-point array device has been employed in a cell array region of a highly-integrated semiconductor device. Specifically, the cross-point array device has been applied to a cell structure of a resistance change device such as a resistive random access memory (ReRAM) device, a phase change random access memory (PcRAM) device, a magnetic random access memory (MRAM) device, or the like. The cell structure may include a plurality of pillar-shaped structures that are formed at cross points of lower and upper electrodes, which intersect each other and are disposed on different planes.

In the cross-point array device, it is difficult to structurally suppress the occurrence of a sneak current between adjacent cells. The sneak current may cause write errors and read errors in cells of the cross-point array device.

SUMMARY

There is provided a cross-point array device according to an aspect of the present disclosure. The cross-point array device includes a pillar-shaped structure disposed in an intersection region where a first conductive line overlaps a second conductive line. The pillar-shaped structure includes a resistance change material layer disposed between the first conductive line and the second conductive line. The pillar-shaped structure includes one or more conductive fuse material layers, each of which is disposed between the first or second conductive line and the resistance change material layer. A melting point of the conductive fuse material layer is higher than A melting point of the resistance change material layer.

There is provided a cross-point array device according to another aspect of the present disclosure. The cross-point array device includes a plurality of first conductive lines extending in a first direction, a plurality of second conductive lines extending in a second direction that crosses the first direction, a plurality of memory cells disposed in intersection regions where the first conductive lines overlap the second conductive lines and including a resistance change material layer, and conductive fuse material layers disposed adjacent to the resistance change material layer in the plurality of memory cells. The melting point of the conductive fuse material layer is higher than the melting point of the resistance change material layer.

DETAILED DESCRIPTION

Figure 1:
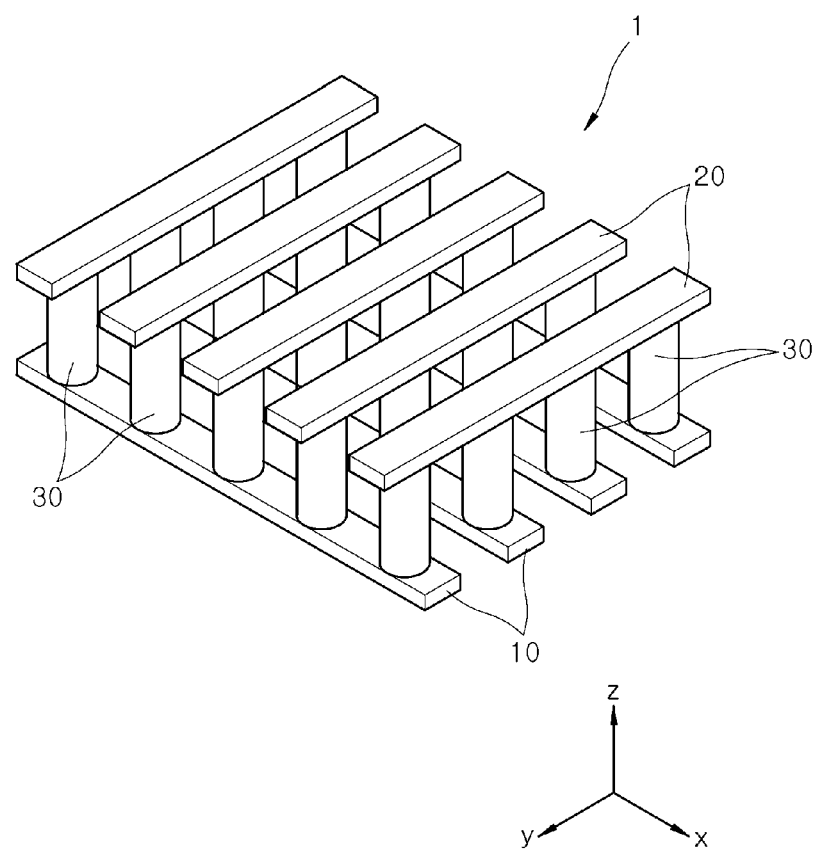
FIG. 1 is a perspective view schematically illustrating a cross-point array device according to an embodiment of the present disclosure.

Various embodiments will now be described hereinafter with reference to the accompanying drawings. In the drawings, the dimensions of layers and regions may be exaggerated for clarity of illustration. The drawings are described with respect to an observer's viewpoint. If an element is referred to be located on another element, it may be understood that the element is directly located on the other element, or an additional element may be interposed between the element and the other element. The same reference numerals refer to the same elements throughout the specification.

In addition, expression of a singular form of a word should be understood to include the plural forms of the word unless clearly used otherwise in the context. It will be understood that the terms "comprise" or "have" are intended to specify the presence of a feature, a number, a step, an operation, an element, a part, or combinations thereof, but not used to preclude the presence or possibility of addition one or more other features, numbers, steps, operations, components, parts, or combinations thereof.

FIG. 1 is a perspective view schematically illustrating a cross-point array device 1 according to an embodiment of the present disclosure. Referring to FIG. 1, the cross-point array device 1 may include first conductive lines 10 extending in an x-direction and arranged in a y-direction, second conductive lines 20 extending in the y-direction and arranged in the x-direction, and pillar-shaped structures 30 extending in a z-direction and disposed in intersection regions between the first conductive lines 10 and the second conductive lines 20. Although, in the embodiment illustrated FIG. 1, a rectangular coordinate system of the x-direction, y-direction, and z-direction is illustrated, embodiments are not limited to the rectangular coordinate system, and any one of various non-rectangular coordinate systems may be used to describe the cross-point array device 1. The pillar-shaped structures 30 may constitute a cell array along the x-direction and the y-direction.

The cross-point array device 1 illustrated in FIG. 1 may function as a resistance change memory device. The resistance change memory device may be defined as a memory device that stores different electrical signals in the pillar-shaped structure 30 and reads out a stored signal by detecting an amount of a current flowing through a selected pillar-shaped structure 30. The selected pillar-shaped structure 30 is disposed at a predetermined position between the first and second conductive lines 10 and 20.

More specifically, each of the pillar-shaped structures 30 may include an active layer generating a resistance change and electrode layers disposed at both ends of the active layer. The active layer may have a resistance changing in response to a voltage applied thereto through the electrode layers. The active layer may store the changing resistance in a nonvolatile manner. As a result, the cross-point array device 1 may be a nonvolatile memory device that uses a variable resistance stored in the active layer of each of the pillar-shaped structures 30 as signal information. The resistance change memory device may include a Resistive RAM (RRAM) device, a Phase change RAM (PRAM) device, a Magnetic RAM (MRAM) device, a ferroelectric RAM (FRAM) device, or the like.

Figure 2:
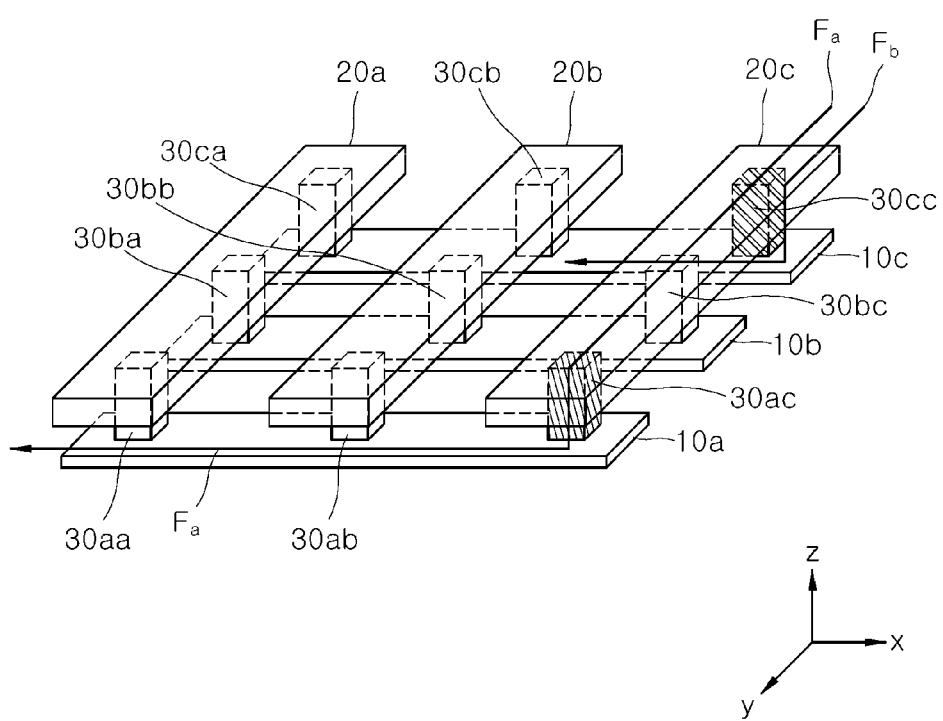
FIG. 2 is a schematic diagram illustrating an operation error that may occur in a cross-point array device, according to a comparative example.

FIG. 2 is a schematic diagram illustrating an operation error that may occur in a cross-point array device 2, as a comparative example. Referring to FIG. 2, the cross-point array device 2 may include first conductive lines 10a, 10b, and 10c extending in an x-direction and arranged in a y-direction; second conductive lines 20a, 20b, and 20c extending in the y-direction and arranged in the x-direction; and pillar-shaped structures 30aa, 30ab, 30ac, 30ba, 30bb, 30bc, 30ca, 30cb, and 30cc extending in a z-direction and being disposed in intersection regions where the first conductive lines 10a, 10b, and 10c overlap the second conductive lines 20a, 20b, and 20c. Each of the pillar-shaped structures 30aa, 30ab, 30ac, 30ba, 30bb, 30bc, 30ca, 30cb and 30cc may include an active layer generating a resistance change and electrode layers disposed at both ends of the active layer.

FIG. 2 illustrates a case where an active layer of the pillar-shaped structure 30cc is electrically broken and thus an excessive leakage current flows through the active layer of the pillar-shaped structure 30cc. In FIG. 2, an ideal current flow for performing write and read operations for the selected pillar-shaped structure 30ac is denoted by 'Fa.' An abnormal actual current flow generated in the cross-point array device 2 due to the excessive leakage current is denoted by 'Fb.'

Referring to FIG. 2, in the case where the active layer of the pillar-shaped structure 30cc is electrically broken, when a write operation is performed for the selected pillar-shaped structure 30ac disposed between the first conductive line 10a and the second conductive line 20c, a write current may flow through the pillar-shaped structure 30cc connected to the same second conductive line 20c. As a result, the selected pillar-shaped structure 30ac may not be provided with a sufficient electric driving force necessary for performing the write operation. Similarly, when a read operation is performed for the selected pillar-shaped structure 30ac, a sneak current is generated through the pillar-shaped structure 30cc, and thus the sneak current may flow through the selected pillar-shaped structure 30ac. Accordingly, a resistance stored in the selected pillar-shaped structure 30ac may not be reliably read out. Consequently, a write error or a read error may occur in the pillar-shaped structures 30ac, 30bc, 30ca, and 30cb that are connected to the electrically broken pillar-shaped structure 30cc through the first conductive line 10c or the second conductive line 20c.

Figure 3:
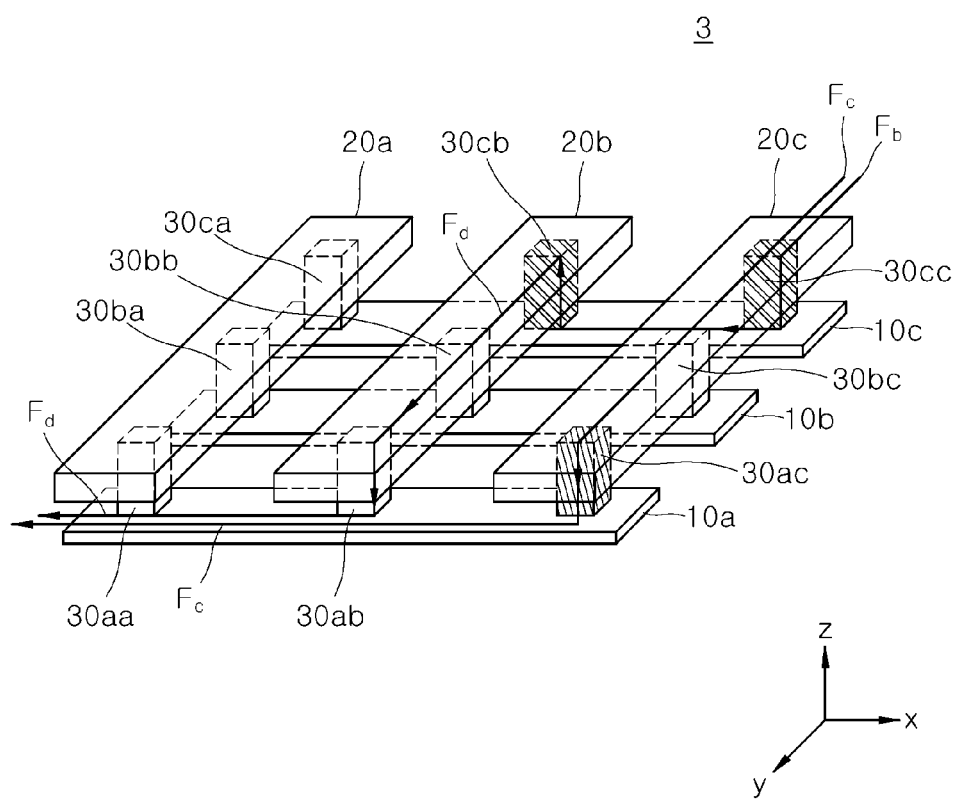
FIG. 3 is a schematic diagram illustrating an operation error that may occur in a cross-point array device, according to another comparative example.

FIG. 3 is a schematic diagram illustrating an operation error that may occur in a cross-point array device 3, according to another comparative example. Referring to FIG. 3, the cross-point array device 3 may include first conductive lines 10a, 10b, and 10c extending in an x-direction and arranged in a y-direction; second conductive lines 20a, 20b, and 20c extending in the y-direction and arranged in the x-direction; and pillar-shaped structures 30aa, 30ab, 30ac, 30ba, 30bb, 30bc, 30ca, 30cb, and 30cc extending in a z-direction and being disposed in intersection regions where the first conductive lines 10a, 10b, and 10c overlap the second conductive lines 20a, 20b, and 20c. Each of the pillar-shaped structures 30aa, 30ab, 30ac, 30ba, 30bb, 30bc, 30ca, 30cb, and 30cc may include an active layer generating a resistance change, and electrode layers being disposed at opposite ends of the active layer.

FIG. 3 illustrates a case where active layers of the pillar-shaped structures 30cb and 30cc are electrically broken and thus an excessive leakage current flows through the active layers of the pillar-shaped structures 30cb and 30cc. In FIG. 3, an ideal current flow for performing write and read operations for the selected pillar-shaped structure 30ac is denoted by 'Fc.' An abnormal actual current flow, which is generated in the cross-point array device 3 due to the excessive leakage current, is denoted by 'Fd.'

Referring to FIG. 3, when a write operation is performed for the selected pillar-shaped structure 30ac disposed between the first conductive line 10a and the second conductive line 20c, a write current may flow to the first conductive line 10c and the second conductive line 20b through the pillar-shaped structures 30cb and 30cc. As a result, the selected pillar-shaped structure 30ac may not be provided with a sufficient electric driving force necessary for performing the write operation. Similarly, when a read operation is performed for the selected pillar-shaped structure 30ac, a sneak current may be generated through the pillar-shaped structures 30cb and 30cc. As a result, a resistance stored in the selected pillar-shaped structure 30ac may not be reliably read out.

More specifically, after the sneak current flows to the first conductive line 10c and the second conductive line 20b through the pillar-shaped structures 30cb and 30cc, the sneak current may flow through at least one pillar-shaped structure (for example, the pillar-shaped structure 30*ab*) that remains in a low resistance state among the pillar-shaped structures 30*ab*, 30*bb*, and 30*cb* connected to the second conductive line 20*b*. As a result, the write operation and the read operation for the selected pillar-shaped structure 30*ac* cannot be reliably performed.

As such, when the active layers of a pair of pillar-shaped structures 30*cb* and 30*cc*, which share the same first conductive line 10*c*, are electrically broken, a write error and a read error may occur simultaneously in the pillar-shaped structures 30*ab*, 30*bc*, 30*ac*, and 30*bb*, which share the second conductive lines 20*b* and 20*c* connected to the pair of pillar-shaped structures 30*cb* and 30*cc*, respectively. Similarly, when an electrical breakdown occurs in a pair of pillar-shaped structures sharing the same second conductive line in the cross-point array device 3, a write error and a read error may occur simultaneously in a plurality of pillar-shaped structures sharing the same first conductive lines connected to the pair of pillar-shaped structures.

Figure 4:
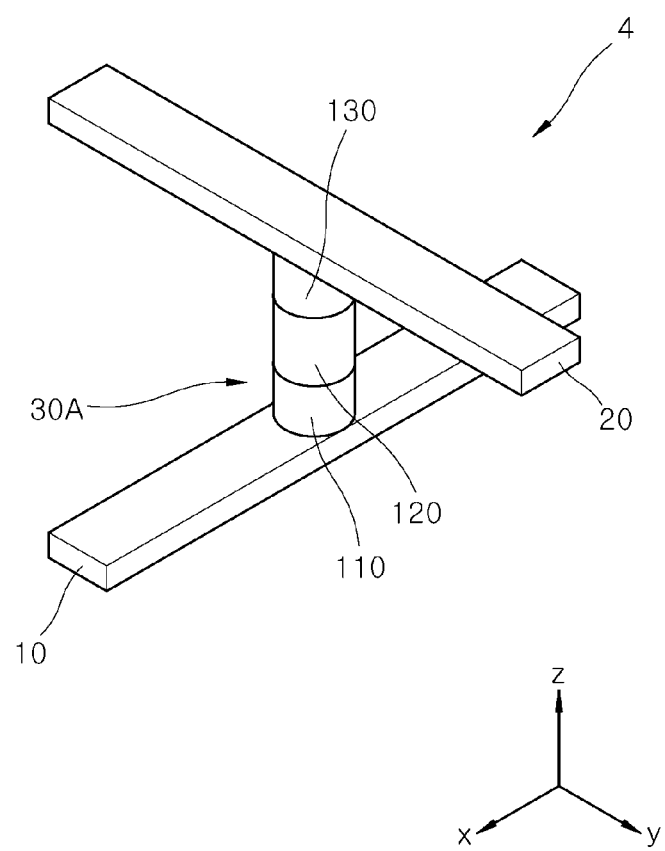
FIG. 4 is a perspective view schematically illustrating a cross-point array device according to an embodiment of the present disclosure.

FIG. 4 is a perspective view schematically illustrating a cross-point array device 4 according to an embodiment of the present disclosure. Referring to FIG. 4, the cross-point array device 4 may include a first conductive line 10 and a second conductive line 20, which intersect each other and are disposed on different planes. The cross-point array device 4 may further include a pillar-shaped structure 30A disposed in an intersection region, which is a region between the first conductive line 10 and the second conductive line 20 where the first conductive line 10 overlaps the second conductive line 20. The pillar-shaped structure 30A may correspond to a memory cell of the cross-point array device 4. Although it is not illustrated, the cross-point array device 4 may include a plurality of pillar-shaped structures 30A arranged in intersection regions between a plurality of first conductive lines 10 and a plurality of second conductive lines 20.

The pillar-shaped structure 30A may include a resistance change material layer 120. The pillar-shaped structure 30A may include a first electrode 110 and a second electrode 130 that are disposed on upper and lower portions of the resistance change material layer 120, respectively. Accordingly, the cross-point array device 4 illustrated in FIG. 4 may function as a resistance change memory device using a variable resistance characteristic of the resistance change material layer 120.

The resistance change material layer 120 may include, for example, a transition metal oxide, a perovskite-based material, a chalcogenide-based material, a ferroelectric material, a ferromagnetic material, or the like. Therefore, the resistance change material layer 120 may function as an active layer of, for example, an RRAM device, a PRAM device, an MRAM device, an FRAM device, or the like.

The first electrode 110 and the second electrode 130 may include a metal, a conductive nitride, a conductive oxide, or the like. In an embodiment, at least one of the first electrode 110 and the second electrode 130 may include a conductive fuse material layer.

The conductive fuse material layer may block an excessive current from flowing through the pillar-shaped structure 30A when the excessive current, which is equal to or greater than a predetermined threshold current, is provided to the conductive fuse material layer. At this time, the threshold current may be greater than an operation current allowed in the resistance change material layer that is in a low resistance state.

One example of a case in which the excessive current, which is equal to or greater than the threshold current, is provided to the conductive fuse material layer may occur when the resistance change material layer 120 in the pillar-shaped structure 30A has defects or is vulnerable to the excessive current and thus the resistance change material layer 120 is electrically broken by an externally applied voltage. Another example of the case in which the excessive current is provided to the conductive fuse material layer may occur when a voltage or current exceeding the tolerance is applied to the pillar-shaped structure 30A from the outside and thus the resistance change material layer 120 is electrically broken. When the resistance change material layer 120 is electrically broken, an excessive leakage current, which is equal to or greater than the threshold current, may flow through the pillar-shaped structure 30A.

Therefore, as described above, the excessive leakage current occurred in the pillar-shaped structure 30A may cause a write error and a read error in adjacent pillar-shaped structures. However, in this embodiment, the conductive fuse material layer can suppress the excessive current flowing through the pillar-shaped structure 30A before the resistance change material layer 120 is electrically broken. As a result, a write error and a read error are prevented from occurring in another pillar-shaped structure adjacent to the pillar-shaped structure 30A.

Figure 5A:
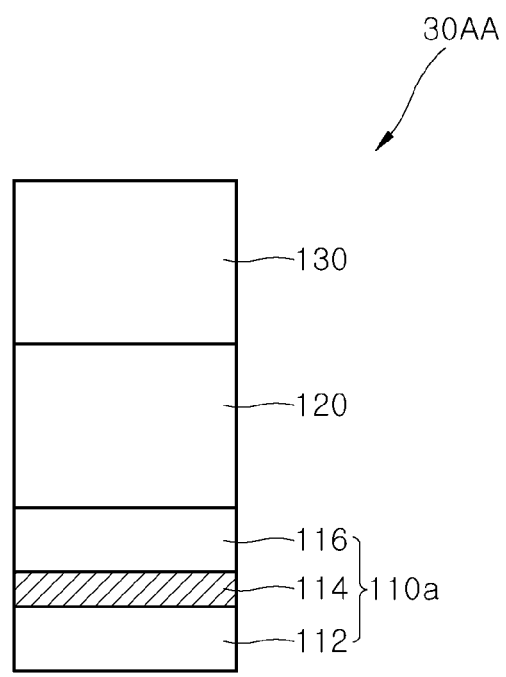
FIGS. 5A to 5C are views schematically illustrating pillar-shaped structures of the cross-point array device of FIG. 4 according to embodiments of the present disclosure.
Figure 5B:
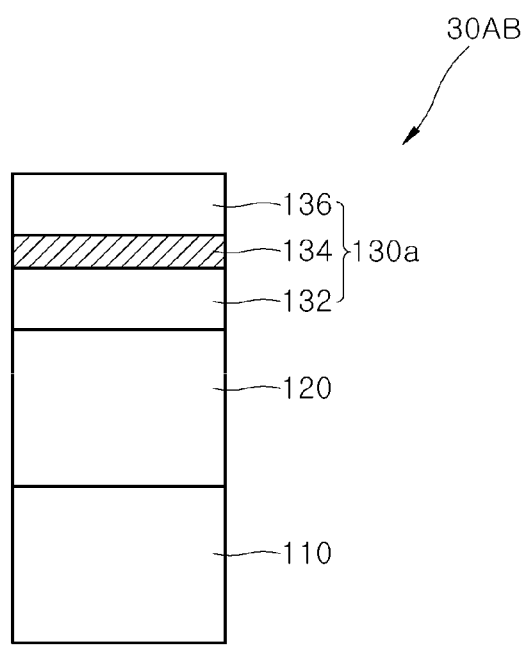
Figure 5C:
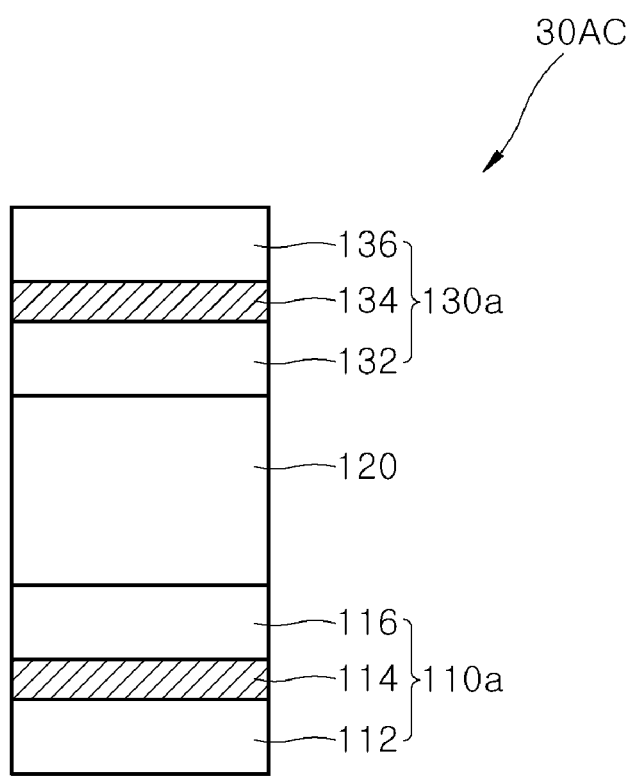

FIGS. 5A to 5C are views schematically illustrating pillar-shaped structures 30AA, 30AB, and 30AC according to embodiments of the present disclosure. The pillar-shaped structures 30AA, 30AB, and 30AC shown in FIGS. 5A to 5C may correspond to memory cells of the cross-point array device 4 of FIG. 4 according to embodiments of the present disclosure.

Referring to FIG. 5A, the pillar-shaped structure 30AA may include a first electrode 110*a*, a resistance change material layer 120, and a second electrode 130. The first electrode 110*a* may include a first sub electrode layer 112, a conductive fuse material layer 114, and a second sub electrode layer 116. The conductive fuse material layer 114 may be disposed inside the first electrode 110*a*. That is, the conductive fuse material layer 114 may be disposed between the first sub electrode layer 112 and the second sub electrode layer 116. Therefore, with respect to the orientation of FIG. 5A, the conductive fuse material layer 114 may not be in physical contact with the resistance change material layer 120, which is disposed on the first electrode 110*a*, and the first conductive line 10 of FIG. 4, which is disposed under the first electrode 110*a*. That is, the conductive fuse material layer 114 may be spaced apart from the resistance change material layer 120 and the first conductive line 10 of FIG. 4.

Each of the first sub electrode layer 112 and the second sub electrode layer 116 may include, for example, a metal, a conductive nitride, a conductive oxide, or the like. Each of the first sub electrode layer 112 and the second sub electrode layer 116 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like. The first sub electrode layer 112 and the second sub electrode layer 116 may be made of the same material or different materials.

The conductive fuse material layer 114 may block an excessive current from flowing through the pillar-shaped structure 30AA when the excessive current, which is equal to or greater than a predetermined threshold current, is provided to the conductive fuse material layer 114. The threshold current may be greater than an operation current allowed in the resistance change material layer 120 when the resistance change material layer 120 is in a low resistance state. For example, the excessive current may have the same magnitude as a leakage current generated when the resistance change material layer 120 is electrically broken.

The conductive fuse material layer 114 may include a material having a melting point higher than a melting point of the resistance change material layer 120. Accordingly, the conductive fuse material layer 114 can work as a fuse after the breakage of the resistance change material layer 120. The breakage may be caused by the heat that is generated by the current exceeding the predetermined threshold current. That is, the conductive fuse material layer 114 can suppress the excessive current from flowing through the pillar-shaped structure 30AA caused by the breakage of the resistance change material layer 120.

In an embodiment, the conductive fuse material layer 114 may be changed from a low resistance state to a high resistance state when the excessive current is provided to the conductive fuse material layer 114. Accordingly, the first sub electrode layer 112 and the second sub electrode layer 116 can be electrically insulated from each other by the conductive fuse material layer 114 when the excessive current is provided to the first electrode 110a.

In another embodiment, the conductive fuse material layer 114 may include a phase change material that changes from a low resistive crystalline state to a high resistive amorphous state when the excessive current is provided to the conductive fuse material layer 114. For example, the conductive fuse material layer 114 may include a chalcogenide-based material as the phase change material. The conductive fuse material layer 114 may include an indium (In)-antimony (Sb)-tellurium (Te) based alloy, a germanium (Ge)-antimony (Sb) based alloy, or the like. In another embodiment, when the resistance change material layer 120 and the conductive fuse material layer 114 each include a phase change material, the melting point of the conductive fuse material layer 114 may be higher than the melting point of the resistance change material layer 120. Accordingly, the conductive fuse material layer 114 can maintain the crystalline state of low resistance within a temperature range in which the resistance change material layer 120 undergoes phase transformation between the crystalline state of low resistance and the amorphous state of high resistance.

In still another embodiment, the conductive fuse material layer 114 may be melted and removed when the excessive current is provided to the conductive fuse material layer 114. Here, removal of the conductive fuse material layer 114 means that at least a portion of the conductive fuse material layer 114 is removed so that the first sub electrode layer 112, which is a lower layer, and the second sub electrode layer 116, which is an upper layer, are electrically insulated from each other by an air portion that is filled with air and generated by the removal of the portion of the conductive fuse material layer 114. The conductive fuse material layer 114 is melted and removed so that a current flow through the conductive fuse material layer 114 can be suppressed. The conductive fuse material layer 114 may include a material having a melting point lower than melting points of the first sub electrode layer 112 and the second sub electrode layer 116. For example, the conductive fuse material layer 114 may include one selected from zinc (Zn), copper (Cu), silver (Ag), aluminum (Al), and an alloy thereof, in consideration of the melting points of the first and second sub electrode layers 112 and 116.

The resistance change material layer 120 may include, for example, a transition metal oxide, a perovskite-based material, a chalcogenide-based material, a ferroelectric material, a ferromagnetic material, or the like. The resistance change material layer 120 may function as an active layer of a resistance change memory device such as an RRAM device, a PRAM device, an MRAM device, an FRAM device, or the like.

The second electrode 130 may include, for example, a metal, a conductive nitride, a conductive oxide, or the like. The second electrode 130 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like.

As described above, in the pillar-shaped structure 30AA, the conductive fuse material layer 114 may be disposed inside the first electrode 110a. When the excessive current is provided to the conductive fuse material layer 114, the conductive fuse material layer 114 can suppress the excessive current from flowing through the pillar-shaped structure 30AA as a leakage current. As a result, the pillar-shaped structure 30AA is prevented from being changed to a conductive state by the excessive current. Thus, a write error or a read error is prevented from occurring in another pillar-shaped structure adjacent to the pillar-shaped structure where the excessive current is suppressed from flowing by the conductive fuse material layer.

Referring to FIG. 5B, the pillar-shaped structure 30AB may include a first electrode 110, a resistance change material layer 120, and a second electrode 130a. A configuration of the pillar-shaped structure 30AB may be substantially the same as a configuration of the pillar-shaped structure 30AA described above with reference to FIG. 5A, except that a conductive fuse material layer is disposed inside the second electrode 130a, rather than the first electrode 110 of FIG. 5A.

The second electrode 130a may include a first sub electrode layer 132, a conductive fuse material layer 134, and a second sub electrode layer 136. Each of the first sub electrode layer 132 and the second sub electrode layer 136 may include, for example, a metal, a conductive nitride, a conductive oxide, or the like. Each of the first sub electrode layer 132 and the second sub electrode layer 136 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like. The first sub electrode layer 132 and the second sub electrode layer 136 may be made of the same material or different materials.

The conductive fuse material layer 134 may have substantially the same configuration and function as the conductive fuse material layer 114 of the pillar-shaped structure 30AA described above with reference to FIG. 5A. The conductive fuse material layer 134 may be disposed inside the second electrode 130a, and may not be in physical contact with the resistance change material layer 120, which is disposed under the second electrode 130a, and the second conductive line 20 of FIG. 4, which is disposed on the second electrode 130a, with respect to the orientation of FIG. 5B. That is, the conductive fuse material layer 134 may be spaced apart from the resistance change material layer 120 and the second conductive line 20.

Referring to FIG. 5C, the pillar-shaped structure 30AC may include a first electrode 110a, a resistance change material layer 120, and a second electrode 130a. The pillar-shaped structure 30AC may have substantially the same configuration as the pillar-shaped structure 30AA described above with reference to FIG. 5A or the pillar-shaped structure 30AB described above with reference to FIG. 5B, except that a conductive fuse material layer is disposed inside each of the first electrode 110a and the second electrode 130a. In FIG. 5C, a conductive fuse material layer 114 is disposed inside the first electrode 110a, and a conductive fuse material layer 134 is disposed inside the second electrode 130a.

The conductive fuse material layer 114 or 134 may have substantially the same configuration and function as the conductive fuse material layer 114 of the pillar-shaped structure 30AA or as the conductive fuse material layer 134 of the pillar-shaped structure 30AB, described above with reference to FIG. 5A or FIG. 5B, respectively.

Figure 6A:
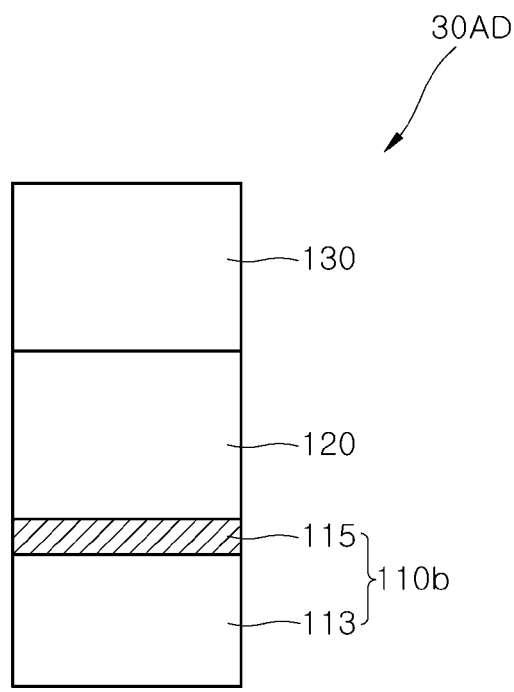
FIGS. 6A to 6C are views schematically illustrating pillar-shaped structures of the cross-point array device of FIG. 4 according to embodiments of the present disclosure.
Figure 6B:
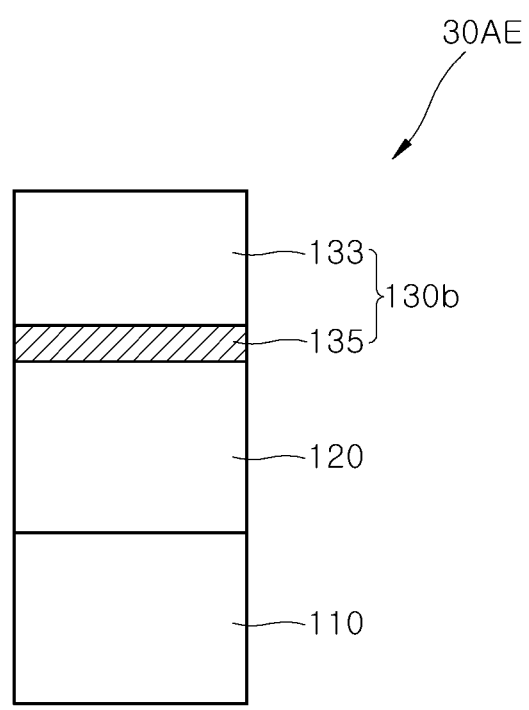
Figure 6C:
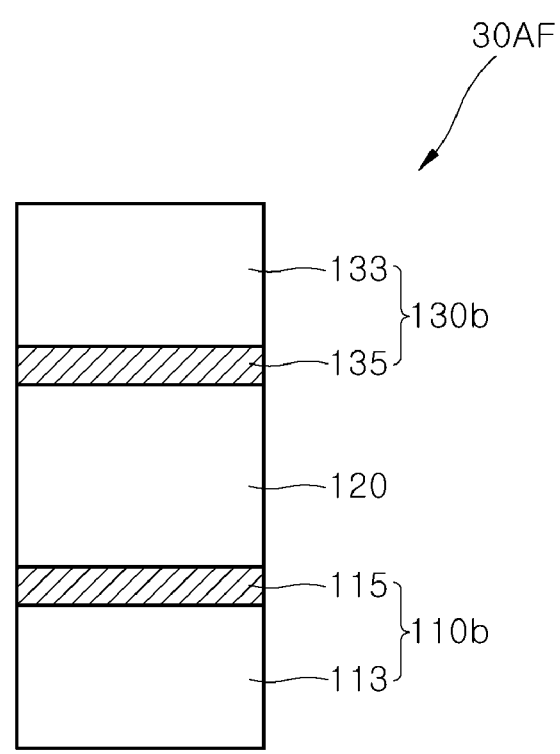

FIGS. 6A to 6C are views schematically illustrating pillar-shaped structures 30AD, 30AE, and 30AF according to embodiments of the present disclosure. The pillar-shaped structures 30AD, 30AE, and 30AF disclosed in FIGS. 6A to 6C may correspond to memory cells of the cross-point array device 4 of FIG. 4 according to embodiments of the present disclosure.

Referring to FIG. 6A, the pillar-shaped structure 30AD may include a first electrode 110b, a resistance change material layer 120, and a second electrode 130. The first electrode 110b may include an electrode material layer 113 and a conductive fuse material layer 115. The conductive fuse material layer 115 may be disposed at an interface between the electrode material layer 113 and the resistance change material layer 120.

The electrode material layer 113 may include, for example, a metal, a conductive nitride, a conductive oxide, or the like. The electrode material layer 113 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide (RuO$_2$), or the like.

The conductive fuse material layer 115 may block an excessive current from flowing through the pillar-shaped structure 30AD when the excessive current, which is equal to or greater than a predetermined threshold current, is provided to the conductive fuse material layer 115. The threshold current may be greater than an operation current allowed in the resistance change material layer 120 when the resistance change material layer 120 is in a low resistance state. For example, the excessive current may be a leakage current generated when the resistance change material layer 120 is electrically broken.

The configuration and function of the conductive fuse material layer 115 may be substantially the same as the configuration and function of the conductive fuse material layer 114 or 134 of the pillar-shaped structures 30AA, 30AB, and 30AC described above with reference to FIGS. 5A to 5C. For example, the conductive fuse material layer 115 may include a material having a melting point higher than the melting point of the resistance change material layer 120. Accordingly, the conductive fuse material layer 115 can work as a fuse after the breakage of the resistance change material layer 120. The breakage may be caused by the heat that is generated by the current exceeding a predetermined threshold current. That is, the conductive fuse material layer 115 can suppress the excessive current from flowing through the pillar-shaped structure 30AD caused by the breakage of the resistance change material layer 120. In an embodiment, when the resistance change material layer 120 and the conductive fuse material layer 115 each include a phase change material, the melting point of the conductive fuse material layer 115 may be higher than the melting point of the resistance change material layer 120. Accordingly, the conductive fuse material layer 115 can maintain the crystalline state of low resistance within a temperature range in which the resistance change material layer 120 undergoes phase transformation between the crystalline state of low resistance and the amorphous state of high resistance.

In another embodiment, unlike the embodiment illustrated in FIG. 6A, one surface of the electrode material layer 113 (e.g., an upper surface of the electrode layer 113) may contact the resistance change material layer 120 and another surface of the electrode layer 113 (e.g., a lower surface of the electrode material layer 113) may contact the conductive fuse material layer 115. In other words, the conductive fuse material layer 115 may be disposed under the electrode material layer 113 with respect to the orientation of FIG. 6A.

Referring to FIG. 6B, the pillar-shaped structure 30AE may include a first electrode 110, a resistance change material layer 120, and a second electrode 130b. A configuration of the pillar-shaped structure 30AE may be substantially the same as the configuration of the pillar-shaped structure 30AD described above with reference to FIG. 6A, except that the second electrode 130b, rather than the first electrode 110, includes a conductive fuse material layer. Thus, the second electrode 130b may include an electrode material layer 133 and a conductive fuse material layer 135. The conductive fuse material layer 135 may be disposed at an interface between the electrode material layer 133 and the resistance change material layer 120.

The electrode material layer 133 may include, for example, a metal, a conductive nitride, a conductive oxide, or the like. The electrode material layer 133 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide (RuO$_2$), or the like.

The conductive fuse material layer 135 may have substantially the same configuration and function as the conductive fuse material layer 115 of the pillar-shaped structure 30AD described above with reference to FIG. 6A.

In another embodiment, unlike the embodiment illustrated in FIG. 6B, one surface of the electrode material layer 133 (e.g., a lower surface of the electrode layer 133) may contact the resistance change material layer 120 and another surface of the electrode layer 133 (e.g., an upper surface of the electrode material layer 133) may contact the conductive fuse material layer 135. In other words, the conductive fuse material layer 135 may be disposed above the electrode material layer 133 with respect to the orientation of FIG. 6B.

Referring to FIG. 6C, the pillar-shaped structure 30AF may include a first electrode 110b, a resistance change material layer 120, and a second electrode 130b. A configuration of the pillar-shaped structure 30AF may be substantially the same as the configuration of the pillar-shaped structure 30AD described above with reference to FIG. 6A or the configuration of the pillar-shaped structure 30AE described above with reference to FIG. 6B, except that the first electrode 110b and the second electrode 130b include conductive fuse material layers 115 and 135, respectively.

The conductive fuse material layers 115 and 135 may be disposed at interfaces with the resistance change material layer 120. The conductive fuse material layer 115 or 135 may have substantially the same configuration and function as the conductive fuse material layer 115 of the pillar-shaped structure 30AD or the conductive fuse material layer 135 of the pillar-shaped structure 30AE described above with reference to FIG. 6A or FIG. 6B, respectively.

In another embodiment, unlike the embodiment illustrated in FIG. 6C, the conductive fuse material layers 115 and 135 may be disposed not to be in physical contact with the resistance change material layer 120. In other words, the conductive fuse material layer 115 and 135 may be spaced apart from the change material layer 120. For example, the conductive fuse material layer 115 may be disposed under the electrode material layer 113 and the conductive fuse material layer 135 may be disposed above the electrode material layer 133 with respect to the orientation of FIG. 6C.

As described above, the pillar-shaped structures described with reference to FIGS. 4, 5A to 5C, and 6A to 6C may correspond to memory cells of a cross-point array device according to embodiments of the present disclosure. Accordingly, a conductive fuse material layer may be disposed in the memory cells. When an excessive current, which is equal to or greater than a threshold current, is provided to one of the plurality of memory cells, the conductive fuse material layer disposed in the one memory cell can suppress the excessive current from passing through the one memory cell, and can thus prevent an information error from occurring during a read operation or a write operation performed on another memory cell adjacent to the one memory cell. Here, the threshold current may be greater than an operation current corresponding to a low resistance signal stored in a memory cell.

Figure 7:
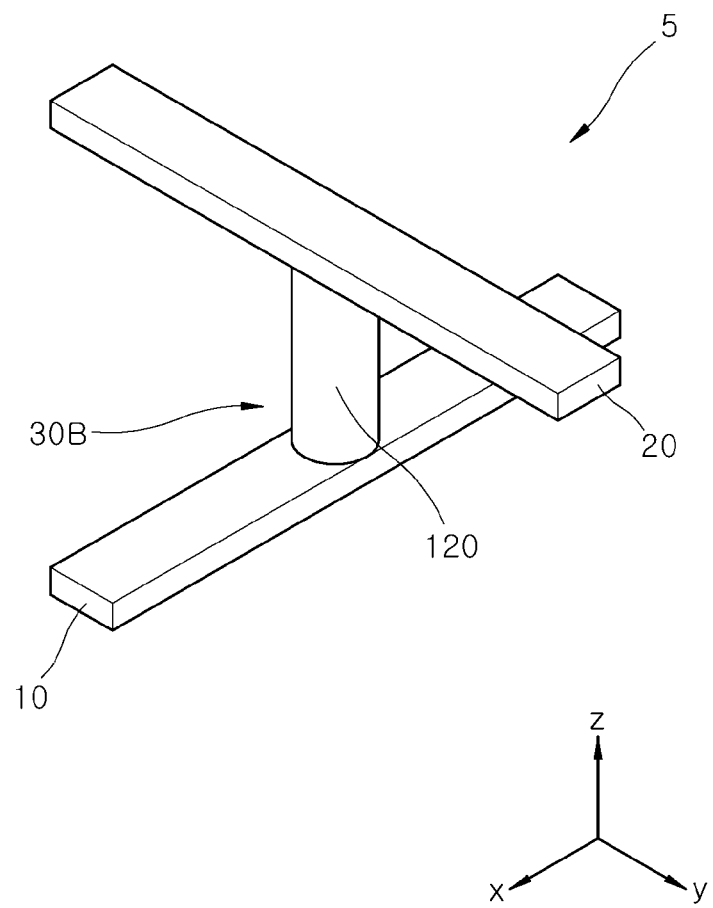
FIG. 7 is a perspective view schematically illustrating a cross-point array device according to an embodiment of the present disclosure.

FIG. 7 is a perspective view schematically illustrating a cross-point array device 5 according to an embodiment of the present disclosure. Referring to FIG. 7, the cross-point array device 5 may include a first conductive line 10 and a second conductive line 20, which intersect each other and are disposed on different planes. A pillar-shaped structure 30B including a resistance change material layer 120 may be disposed in an intersection region where the first conductive line 10 overlaps the second conductive line 20.

In this embodiment, the first conductive line 10 and the second conductive line 20 may function as electrode layers disposed at both ends of the resistance change material layer 120. A conductive fuse material layer (not illustrated) may be disposed between at least one of the first and second conductive lines 10 and 20 and the resistance change material layer 120.

Figure 8A:
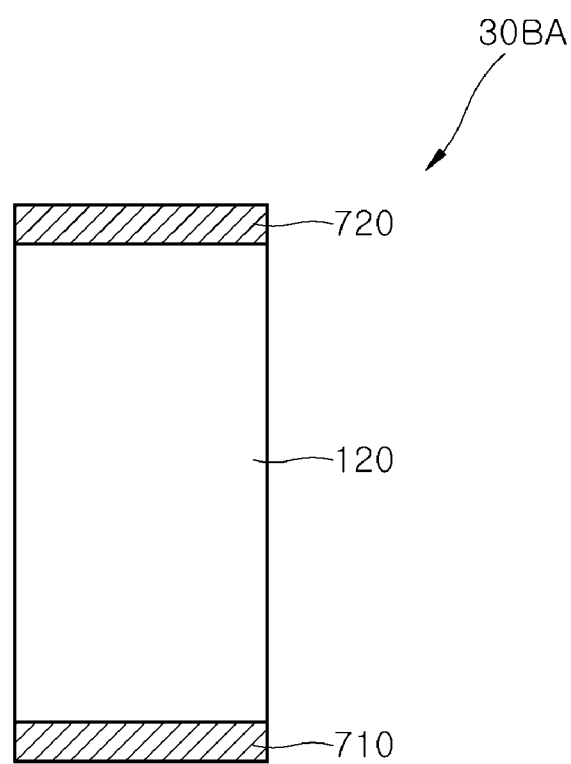
FIGS. 8A to 8C are views schematically illustrating pillar-shaped structures of the cross-point array device of FIG. 7 according to embodiments of the present disclosure.
Figure 8B:
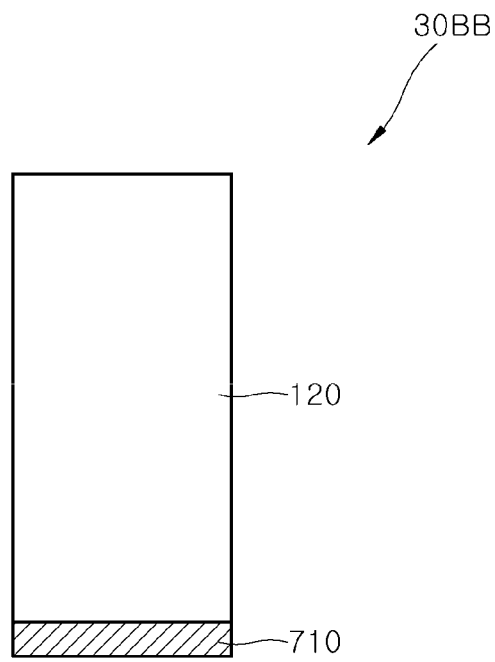
Figure 8C:
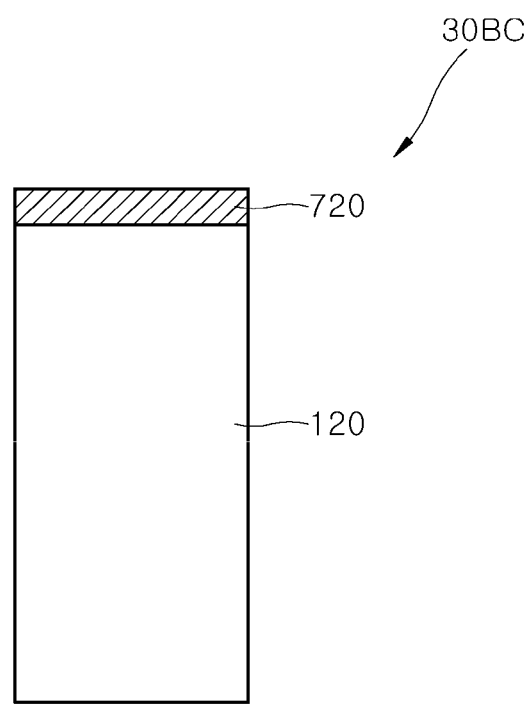

FIGS. 8A to 8C are views schematically illustrating pillar-shaped structures 30BA, 3OBB, and 30BC of the cross-point array device of FIG. 7 according to embodiments of the present disclosure. Referring to FIG. 8A, the pillar-shaped structure 30BA may include a resistance change material layer 120 and conductive fuse material layers 710 and 720. The conductive fuse material layers 710 and 720 may be disposed between the resistance change material layer 120 and the first conductive line 10 of FIG. 7, and between the resistance change material layer 120 and the second conductive line 20 of FIG. 7, respectively.

Referring to FIG. 8B, the pillar-shaped structure 30BB may include a resistance change material layer 120 and a conductive fuse material layer 710. The conductive fuse material layer 710 may be disposed only between the resistance change material layer 120 and the first conductive line 10 of FIG. 7.

Referring to FIG. 8C, the pillar-shaped structure 30BC may include a resistance change material layer 120 and a conductive fuse material layer 720. The conductive fuse material layer 720 may be disposed only between the resistance change material layer 120 and the second conductive line 20 of FIG. 7.

Configurations of the above-described conductive fuse material layers 710 and 720 may be substantially the same as the configuration of any of the conductive fuse material layers 114, 115, 134, and 135 of the pillar-shaped structures 30AA, 30AB, 30AC, 30AD, 30AE, and 30AF described above with reference to FIGS. 4, 5A to 5C, and 6A to 6C. For example, the conductive fuse material layers 710 and 720 may each include a material having a melting point higher than the melting point of the resistance change material layer 120. Accordingly, the conductive fuse material layers 710 and 720 can work as fuses after the breakage of the resistance change material layer 120. The breakage may be caused by the heat that is generated by the current exceeding a predetermined threshold current. That is, the conductive fuse material layer 710 and 720 can suppress the excessive current from flowing through the pillar-shaped structures 30BA, 3OBB and 30BC caused by the breakage of the resistance change material layer 120. In an embodiment, when the resistance change material layer 120 and the conductive fuse material layers 710 and 720 each include a phase change material, the melting point of each of the conductive fuse material layers 710 and 720 may be higher than the melting point of the resistance change material layer 120. Accordingly, the conductive fuse material layers 710 and 720 can maintain the crystalline state of low resistance within a temperature range in which the resistance change material layer 120 undergoes phase transformation between the crystalline state of low resistance and the amorphous state of high resistance.

Figure 9:
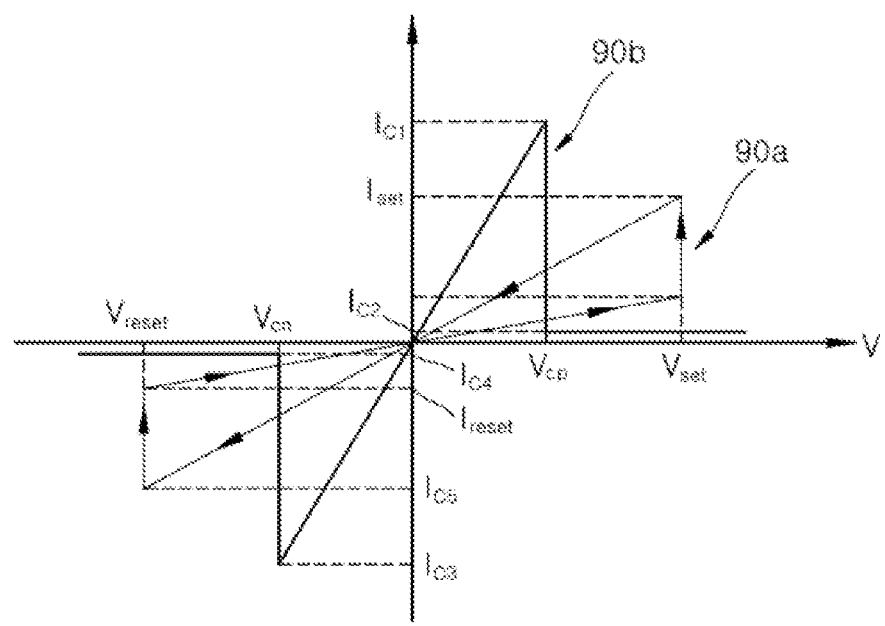
FIG. 9 is a graph illustrating an operation of a memory cell according to an embodiment of the present disclosure.

FIG. 9 is a graph schematically illustrating an operation of a memory cell according to an embodiment of the present disclosure. The memory cell may have any one of the pillar-shaped structures of the cross-point array devices described above with reference to FIGS. 4, 5A to 5C, 6A to 6C, 7, and 8A to 8C. The pillar-shaped structure may include a resistance change material layer and one or more conductive fuse material layers.

Referring to FIG. 9, a first graph 90$a$ shows a current-voltage (I-V) characteristic of a normal memory cell, and a second graph 90$b$ shows a current-voltage (I-V) characteristic of an abnormal memory cell. A memory cell of a resistive random access memory (RRAM) device is used as an example of a memory cell according to an embodiment of the present disclosure, but the memory cell according to the embodiment is not necessarily limited to the memory cell of the RRAM and may be applied to a PRAM device, an MRAM device, or an FRAM device. The abnormal memory cell may be in a state in which a resistance change material layer is electrically broken, or in a state in which the breakage of the resistance change material layer is caused by an externally applied voltage.

Referring to the first graph 90$a$ in FIG. 9, when a voltage having a positive bias is applied to the normal memory cell which is initially in a high resistance state, a relatively low operation current flows through the memory cell until the applied voltage reaches a set voltage Vset. When the applied voltage reaches the set voltage Vset, a set operation is performed on the memory cell, and thus the resistance state of the memory cell is converted from the high resistance state into a low resistance state. Accordingly, the operation current of the memory cell increases to a set current (Iset) level by the set operation. Subsequently, when the applied voltage decreases for the memory cell that has been converted into the low resistance state, the operation current may decrease accordingly.

Meanwhile, when a voltage having a negative bias is applied to the memory cell that is in the low resistance state, a relatively high operation current flows through the memory cell until the applied voltage reaches a reset voltage Vreset. When the applied voltage reaches the reset voltage Vreset, a reset operation is performed on the memory cell, and thus the resistance state of the memory cell is converted from the low resistance state into the high resistance state. Accordingly, the operation current of the memory cell decreases to a reset current (Ireset) level by the reset operation. Subsequently, when the applied voltage decreases for the memory cell that has been converted into the high resistance state, the operation current may decrease.

Referring to the second graph 90b of FIG. 9, when a voltage having a positive bias is applied to the abnormal memory cell, an operation current flowing through the memory cell may greatly increase, relative to other operation current changes, because a resistance change material layer in the memory cell is electrically broken. When the operation current reaches a threshold current $I_{C1}$, a conductive fuse material layer in the memory cell can suppress an excessive current flowing in the memory cell. The threshold current $I_{C1}$ may be greater than the set current Iset corresponding to a low resistance signal of the memory cell.

As illustrated in FIG. 9, when the applied voltage reaches a threshold voltage Vcp that the conductive fuse material layer functions at, a current flowing in the memory cell may decrease from the threshold current $I_{C1}$ to a first insulating current $I_{C2}$. The first insulating current $I_{C2}$ may be a sufficiently low current at which the memory cell is electrically insulated. The threshold voltage Vcp may be less than the set voltage Vset of the memory cell. As a result, an electric current flow occurring in the abnormal memory cell, in which the resistance change material layer is electrically broken, can be prevented.

Similarly, in a case in which a voltage having a negative bias is applied to the abnormal memory cell including the resistance change material layer that is electrically broken, the operation current flowing in the abnormal memory cell may greatly increase relative to other operation current changes. When the operation current reaches a threshold current $I_{C3}$, the conductive fuse material layer can suppress a current flowing in the memory cell. For example, an absolute value of the threshold current $I_{C3}$ may be greater than an absolute value of an operation current $I_{C5}$ that is allowed when a voltage is applied with a negative bias to the normal memory cell.

As illustrated in FIG. 9, when the applied voltage reaches a threshold voltage Vcn, an absolute value of a current flowing in the abnormal memory cell may decrease from the threshold current $I_{C3}$ to a second insulating current $I_{C4}$. The second insulating current $I_{C4}$ may be a sufficiently low current at which the memory cell is electrically insulated. The threshold voltage Vcn may be less than the reset voltage Vreset of the memory cell. As a result, the electrification phenomenon occurring in the abnormal memory cell can be prevented.

Figure 10:
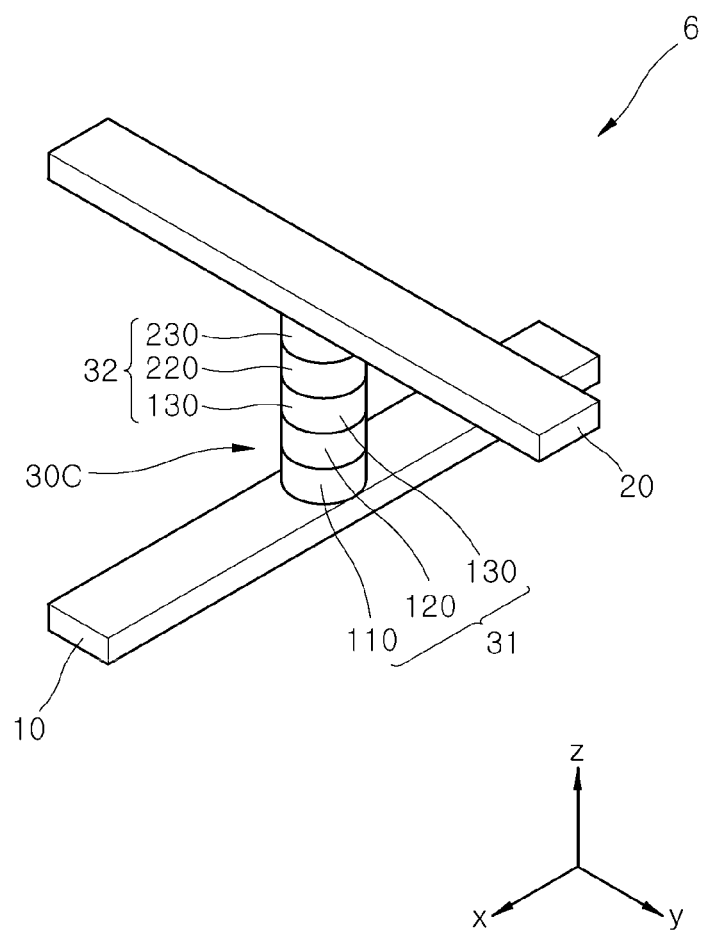
FIG. 10 is a perspective view schematically illustrating a cross-point array device according to an embodiment of the present disclosure.

FIG. 10 is a perspective view schematically illustrating a cross-point array device 6 according to an embodiment of the present disclosure. Referring to FIG. 10, the cross-point array device 6 may include a first conductive line 10 and a second conductive line 20, which intersect each other and are disposed on different planes. The cross-point array device 6 may further include a pillar-shaped structure 30C disposed in an intersection region where the first conductive line 10 overlaps the second conductive line 20. The pillar-shaped structure 30C may correspond to a memory cell of the cross-point array device 6.

The pillar-shaped structure 30C may include a first electrode 110, a resistance change material layer 120, a second electrode 130, a threshold switching operation layer 220, and a third electrode 230. The first electrode 110, the resistance change material layer 120, and the second electrode 130 may constitute a memory element 31. The second electrode 130, the threshold switching operation layer 220, and the third electrode 230 may constitute a selection element 32. The second electrode 130 may be shared by the memory element 31 and the selection element 32.

In the embodiment illustrated in FIG. 10, the threshold switching operation layer 220 is disposed over the resistance change material layer 120. However, in another embodiment, the threshold switching operation layer 220 may be disposed below the resistance change material layer 120.

In the pillar-shaped structure 30C, the memory element 31 has a memory characteristic, and may therefore store a variable resistance as an electrical signal. The selection element 32 has a non-memory characteristic, and may therefore implement a threshold switching operation. The selection element 32 may be electrically connected in series with the memory element 31, and may act as an electrical switch with respect to the memory element 31.

The first to third electrodes 110, 130, and 230 may include, for example, a metal, a conductive nitride, a conductive oxide, or the like. The first to third electrodes 110, 130, and 230 may include any one of gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), and the like.

The resistance change material layer 120 may include, for example, a transition metal oxide material, a perovskite-based material, a chalcogenide-based material, a ferroelectric material, a ferromagnetic material, or the like.

When a voltage applied to the selection element 32 increases beyond a threshold voltage, the threshold switching operation layer 220 may have a low resistance state. When the voltage applied to the selection element 32 decreases below the threshold voltage, the threshold switching operation layer 220 may have a high resistance state.

The threshold switching operation layer 220 may include, for example, any one of a silicon oxide material, a silicon nitride material, a metal oxide material, and a metal nitride material, and a combination thereof. For example, the threshold switching operation layer 220 may include any one of an aluminum oxide material, a zirconium oxide material, a hafnium oxide material, a tungsten oxide material, a titanium oxide material, a nickel oxide material, a copper oxide material, a manganese oxide material, a tantalum oxide material, a niobium oxide material, an iron oxide material, and a combination thereof. The threshold switching operation layer 220 may include a chalcogenide-based material containing at least one of tellurium (Te), selenium (Se), silicon (Si), titanium (Ti), sulfur (S), antimony (Sb), germanium (Ge), and arsenic (As).

The threshold switching operation layer 220 may include a compound material having a composition that does not satisfy a stoichiometric ratio. The threshold switching operation layer 220 may have an amorphous structure.

In this embodiment, at least one of the first to third electrodes 110, 130, and 230 may include a conductive fuse material layer. The conductive fuse material layer can block a current from flowing through the pillar-shaped structure 30C when an excessive current, which is equal to or greater than a predetermined threshold current, is provided to the conductive fuse material layer. The threshold current may be greater than an operation current allowed through the resistance change material layer 120 when the resistance change material layer 120 is in a low resistance state.

In an example, the excessive current may be provided to the conductive fuse material layer when the resistance change material layer 120 or the threshold switching operation layer 220 has a defect, and thus the resistance change material layer 120 or the threshold switching operation layer 220 is electrically destroyed by an externally applied voltage. In another example, the excessive current may flow through the pillar-shaped structure 30C when a voltage or a current exceeding the tolerance is applied to the pillar-shaped structure 30C from the outside, and thus the resistance change material layer 120 or the threshold switching operation layer 220 is electrically destroyed. When the resistance change material layer 120 or the threshold switching operation layer 220 is electrically destroyed, an excessive leakage current, which is equal to or greater than the threshold current, may flow through the pillar-shaped structure 30C.

As described above, when an excessive leakage current occurs in a pillar-shaped structure, a write error or a read error may occur in other pillar-shaped structures adjacent to the pillar-shaped structure in which the excessive leakage current occurs. However, according to this embodiment, the conductive fuse material layer can suppress the excessive leakage current from flowing through the pillar-shaped structure when the resistance change material layer 120 is electrically destroyed. As a result, a write error or a read error is prevented from occurring in the other pillar-shaped structures adjacent to the pillar-shaped structure in which the excessive leakage current occurs.

Figure 11A:
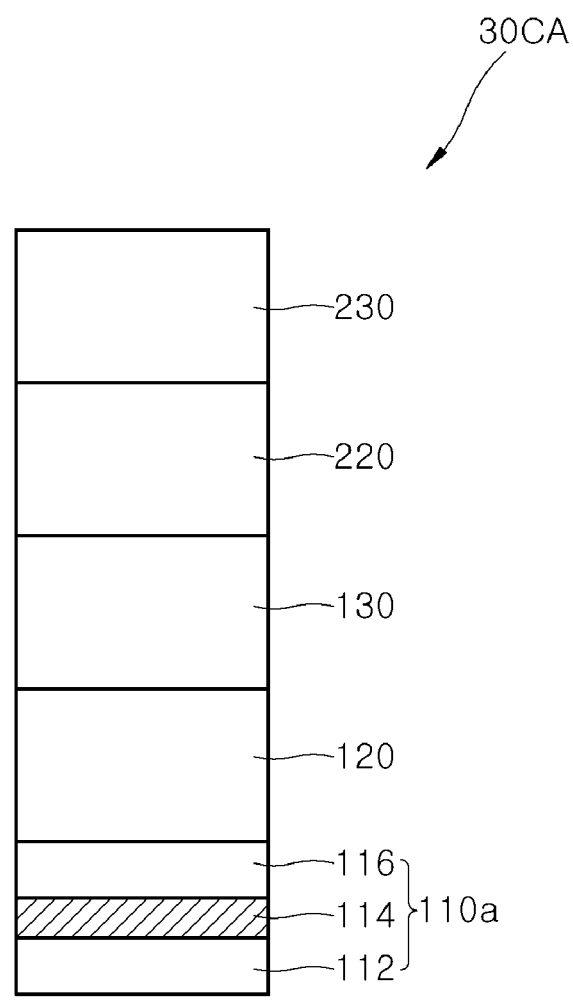
FIGS. 11A to 11C are views schematically illustrating pillar-shaped structures of the cross-point array device of FIG. 10 according to embodiments of the present disclosure.
Figure 11B:
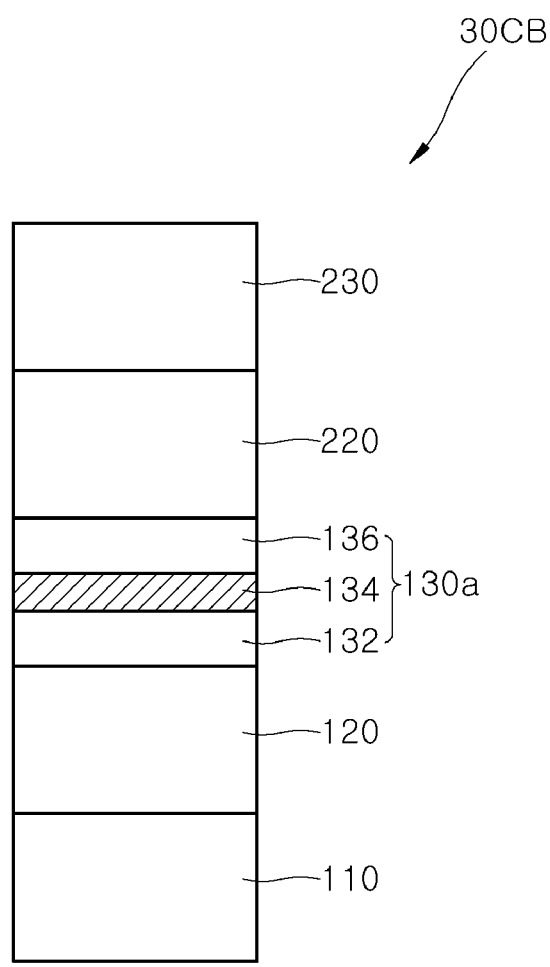
Figure 11C:
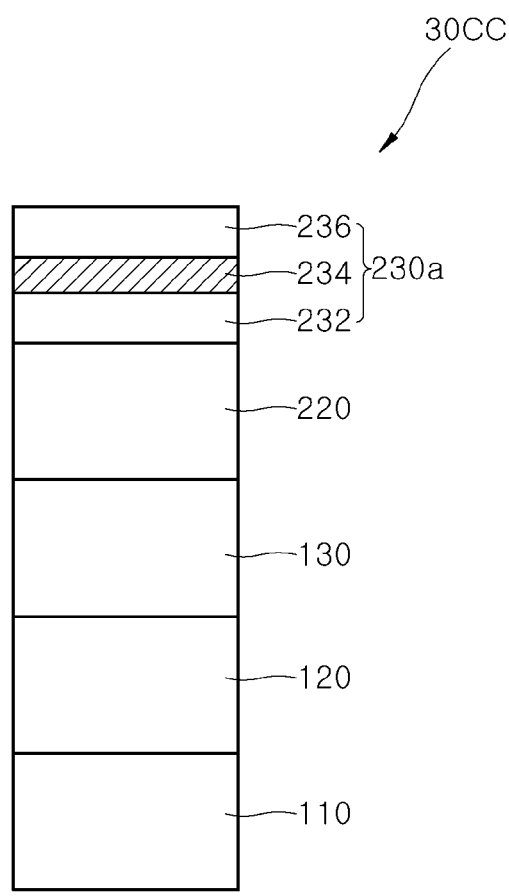

FIGS. 11A to 11C are views schematically illustrating pillar-shaped structures 30CA, 30CB, and 30CC according to embodiments of the present disclosure. The pillar-shaped structures 30CA, 30CB, and 30CC disclosed in FIGS. 11A to 11C may correspond to memory cells of the cross-point array device 6 of FIG. 10 according to embodiments of the present disclosure.

Referring to FIG. 11A, the pillar-shaped structures 30CA may include a first electrode 110a, a resistance change material layer 120, a second electrode 130, a threshold switching operation layer 220, and a third electrode 230. The first electrode 110a may include a first sub electrode layer 112, a conductive fuse material layer 114, and a second sub electrode layer 116.

The conductive fuse material layer 114 may be disposed inside the first electrode 110a. That is, the conductive fuse material layer 114 may not be in physical contact with the resistance change material layer 120 and the first conductive line 10 of FIG. 10. That is, the conductive fuse material layer 114 may be spaced apart from the resistance change material layer 120 and the first conductive line 10. The first conductive line 10 may be disposed under the first electrode 110a with respect to the orientation of FIG. 11A. In this embodiment, the conductive fuse material layer 114 is disposed between the first sub electrode layer 112 and the second sub electrode layer 116. In an embodiment, the conductive fuse material layer 114 may include a material having a melting point higher than those of the resistance change material layer 120 and threshold switching operation layer 220. Accordingly, the conductive fuse material layer 114 can work as a fuse after the breakage of the resistance change material layer 120 and the threshold switching operation layer 220. The breakages may be caused by the heat that is generated by the current exceeding a predetermined threshold current. That is, the conductive fuse material layer 114 can suppress the excessive current from flowing through the pillar-shaped structures 30CA caused by the breakage of the resistance change material layer 120 and the threshold switching operation layer 220.

Each of the first sub electrode layer 112 and the second sub electrode layer 116 may include, for example, a metal, a conductive nitride material, a conductive oxide material, or the like. The first sub electrode layer 112 and the second sub electrode layer 116 may be made of the same material or different materials.

The conductive fuse material layer 114 may be converted from a conductor into a non-conductor when an excessive current, which is equal to or greater than a threshold current, is provided to the conductive fuse material layer 114. The conductive fuse material layer 114 may include a phase change material that changes from a low resistive crystalline state to a high resistive amorphous state by the excessive current. For example, the conductive fuse material layer 114 may include a chalcogenide-based material. The conductive fuse material layer 114 may include an indium (In)-antimony (Sb)-tellurium (Te)-based alloy, a germanium (Ge)-antimony (Sb)-based alloy, or the like.

Alternatively, the conductive fuse material layer 114 may be melted and removed when the excessive current is provided to the conductive fuse material layer 114. Here, removing the conductive fuse material layer 114 means that at least a portion of the conductive fuse material layer 114 is removed, so that the first sub electrode layer 112, which is under the conductive fuse material layer 114, and the second sub electrode layer 116, which is above the conductive fuse material layer 114, are electrically insulated from each other by an air portion that is filled with air and generated by the removal of the portion of the conductive fuse material layer 114.

The conductive fuse material layer 114 may include a material having a melting point that is lower than melting points of the first sub electrode layer 112 and the second sub electrode layer 116. For example, the conductive fuse material layer 114 may include zinc (Zn), copper (Cu), silver (Ag), aluminum (Al), or an alloy thereof, in consideration of the melting points of the first and second electrode layers 112 and 116.

Referring to FIG. 11B, the pillar-shaped structure 30CB may include a first electrode 110, a resistance change material layer 120, a second electrode 130a, a threshold switching operation layer 220, and a third electrode 230. A configuration of the pillar-shaped structure 30CB may be substantially the same as the configuration of the pillar-shaped structure 30CA described above with reference to FIG. 11A except that a conductive fuse material layer is disposed in the second electrode 130a, rather than the first electrode 110.

The second electrode 130a may include a first sub electrode layer 132, a conductive fuse material layer 134, and a second sub electrode layer 136. Each of the first sub electrode layer 132 and the second sub electrode layer 136 may include, for example, a metal, a conductive nitride material, a conductive oxide material, or the like. Each of the first sub electrode layer 132 and the second sub electrode layer 136 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like. The first sub electrode layer 132 and the second sub electrode layer 136 may be made of the same material or different materials.

The conductive fuse material layer 134 may have substantially the same configuration and function as the conductive fuse material layer 114 of the pillar-shaped structure 30CA described above with reference to FIG. 11A. The conductive fuse material layer 134 may be disposed in the second electrode 130a and may not be in physical contact with the resistance change material layer 120 and the threshold switching operation layer 220. That is, the conductive fuse material layer 134 may be spaced apart from the resistance change material layer 120 and the threshold switching operation layer 220. In this embodiment, the conductive fuse material layer 134 is disposed between the first sub electrode layer 132 and the second sub electrode layer 136.

Referring to FIG. 11C, the pillar-shaped structure 30CC may include a first electrode 110, a resistance change material layer 120, a second electrode 130, a threshold switching operation layer 220, and a third electrode 230a. A configuration of the pillar-shaped structure 30CC may be substantially the same as the configuration of the pillar-shaped structure 30CA described above with reference to FIG. 11A, except that a conductive fuse material layer is disposed in the third electrode 230a rather than the first electrode 110.

The third electrode 230a may include a first sub electrode layer 232, a conductive fuse material layer 234, and a second sub electrode layer 236. Each of the first sub electrode layer 232 and the second sub electrode layer 236 may include, for example, a metal, a conductive nitride material, a conductive oxide material, or the like. Each of the first sub electrode layer 232 and the second sub electrode layer 236 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like. The first sub electrode layer 232 and the second sub electrode layer 236 may be made of the same material or different materials.

The conductive fuse material layer 234 may have substantially the same configuration and function as the conductive fuse material layer 114 of the pillar-shaped structure 30CA described above with reference to FIG. 11A. In this embodiment, the conductive fuse material layer 234 may be disposed inside the second electrode 230a, and may not be in physical contact with the threshold switching operation layer 220 and the second conductive line 20 of FIG. 10, which is disposed above the third electrode 230a with respect to the orientation of FIG. 11C. That is, the conductive fuse material layer 234 may be spaced apart from the threshold switching operation layer 220 and the second conductive line 20. In this embodiment, the conductive fuse material layer 234 is disposed between the first sub electrode layer 232 and the second sub electrode layer 236.

In some embodiments, a conductive fuse material layer may be disposed in each of a first electrode and a second electrode, each of the second electrode and a third electrode, or each of the first electrode and the third electrode, so that two conductive fuse material layers may be included in a pillar-shaped structure. Alternatively, a conductive fuse material layer may be disposed in each of the first electrode, the second electrode, and the third electrode, so that three conductive fuse material layers may be included in the pillar-shaped structure.

FIGS. 12A to 12D are views schematically illustrating pillar-shaped structures 30CD, 30CE, 30CF, and 30CG according to embodiments of the present disclosure. The pillar-shaped structures 30CD, 30CE, 30CF, and 30CG disclosed in FIGS. 12A to 12D may correspond to memory cells of the cross-point array device 6 of FIG. 10 according to embodiments of the present disclosure.

Figure 12A:
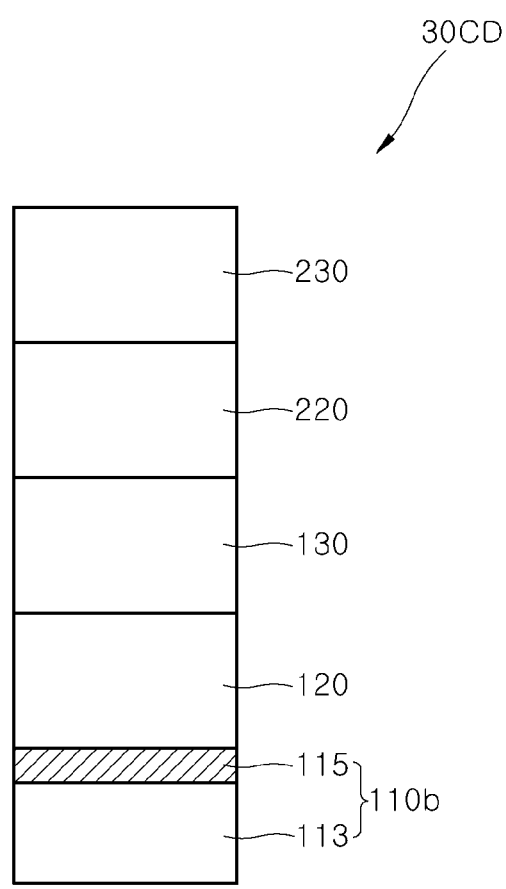
FIGS. 12A to 12D are views schematically illustrating pillar-shaped structures of the cross-point array device of FIG. 10 according to an embodiment of the present disclosure.

Referring to FIG. 12A, the pillar-shaped structure 30CD may include a first electrode 110b, a resistance change material layer 120, a second electrode 130, a threshold switching operation layer 220, and a third electrode 230. The first electrode 110b may include an electrode material layer 113 and a conductive fuse material layer 115. The conductive fuse material layer 115 may be disposed at an interface between the electrode material layer 113 and the resistance change material layer 120.

The conductive fuse material layer 115 may have substantially the same configuration and function as the conductive fuse material layer 114, 134, or 234 of the pillar-shaped structure 30CA, 30CB, or 30CC described above with reference to FIG. 11A, 11B, or 11C, respectively. For example, the conductive fuse material layer 115 may include a material having a melting point higher than those of the resistance change material layer 120 and threshold switching operation layer 220. Accordingly, the conductive fuse material layer 115 can work as a fuse after the breakage of the resistance change material layer 120 and threshold switching operation layer 220. The breakages may be caused by the heat that is generated by the current exceeding a predetermined threshold current. That is, the conductive fuse material layer 115 can suppress the excessive current from flowing through the pillar-shaped structures 30CD caused by the breakage of the resistance change material layer 120 and threshold switching operation layer 220.

In some other embodiments, unlike the embodiment illustrated in FIG. 12A, the electrode material layer 113 and the conductive fuse material layer 115 may be disposed so that the conductive fuse material layer 115 does not contact the resistance change material layer 120. More specifically, one surface of the electrode material layer 113 (e.g., an upper surface of the electrode material layer 113) may contact the resistance change material layer 120 and another surface of the electrode material layer 113 (e.g., a lower surface of the electrode material layer 113) may contact the conductive fuse material layer 115. Thus, the conductive fuse material layer 115 may be contact the first conductive line 10 of FIG. 10 that is disposed under the first electrode 110b with respect to the orientation of FIG. 12A. Thus, the conductive fuse material layer 115 may be disposed between the electrode material layer 113 and the first conducive line 10 of FIG. 10.

Figure 12B:
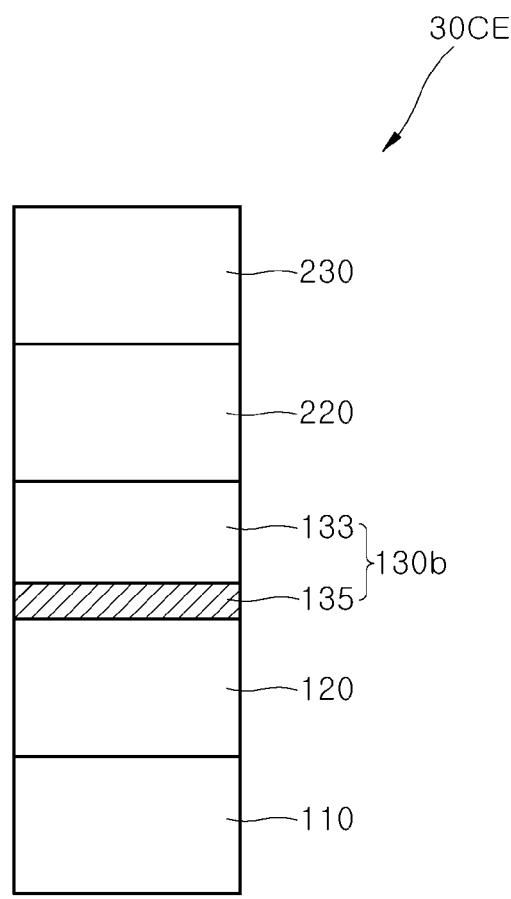

Referring to FIG. 12B, the pillar-shaped structure 30CE may include a first electrode 110, a resistance change material layer 120, a second electrode 130b, a threshold switching operation layer 220, and a third electrode 230. A configuration of the pillar-shaped structure 30CE may be substantially the same as the configuration of the pillar-shaped structure 30CD described above with reference to FIG. 12A, except that the second electrode 130b, rather than the first electrode 110, includes a conductive fuse material layer.

The second electrode 130b may include an electrode material layer 133 and a conductive fuse material layer 135. The conductive fuse material layer 135 may be disposed at an interface between the electrode material layer 133 and the resistance change material layer 120.

The electrode material layer 133 may include, for example, a metal, a conductive nitride material, a conductive oxide material, or the like. The electrode material layer 133 may include, for example, gold (Au), aluminum (Al), platinum (Pt), copper (Cu), silver (Ag), ruthenium (Ru), titanium (Ti), iridium (Ir), tungsten (W), a titanium nitride (TiN), a tantalum nitride (TaN), a ruthenium oxide ($RuO_2$), or the like.

The conductive fuse material layer 135 may have substantially the same configuration and function as the conductive fuse material layer 115 of the pillar-shaped structure 30CD described above with reference to FIG. 12A.

Figure 12C:
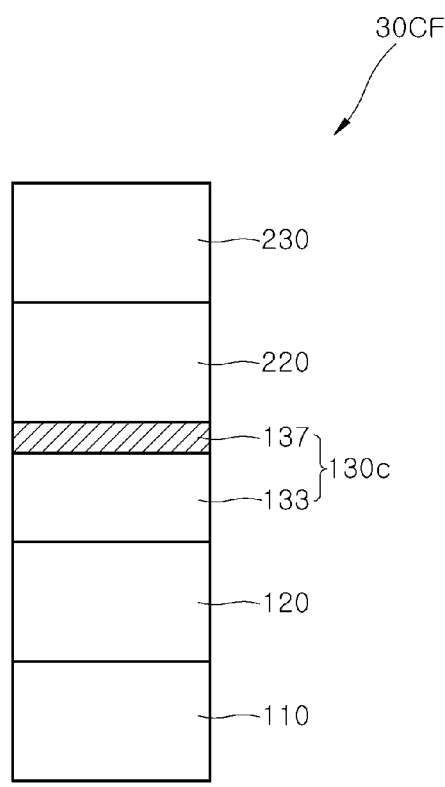

Referring to FIG. 12C, the pillar-shaped structure 30CF may include a first electrode 110, a resistance change material layer 120, a second electrode 130c, a threshold switching operation layer 220, and a third electrode 230. The second electrode 130c may include an electrode material layer 133 and a conductive fuse material layer 137. The conductive fuse material layer 137 may be disposed at an interface between the electrode material layer 133 and the threshold switching operation layer 220.

The conductive fuse material layer 137 may have substantially the same configuration and function as the conductive fuse material layer 115 of the pillar-shaped structure 30CD described above with reference to FIG. 12A.

Figure 12D:
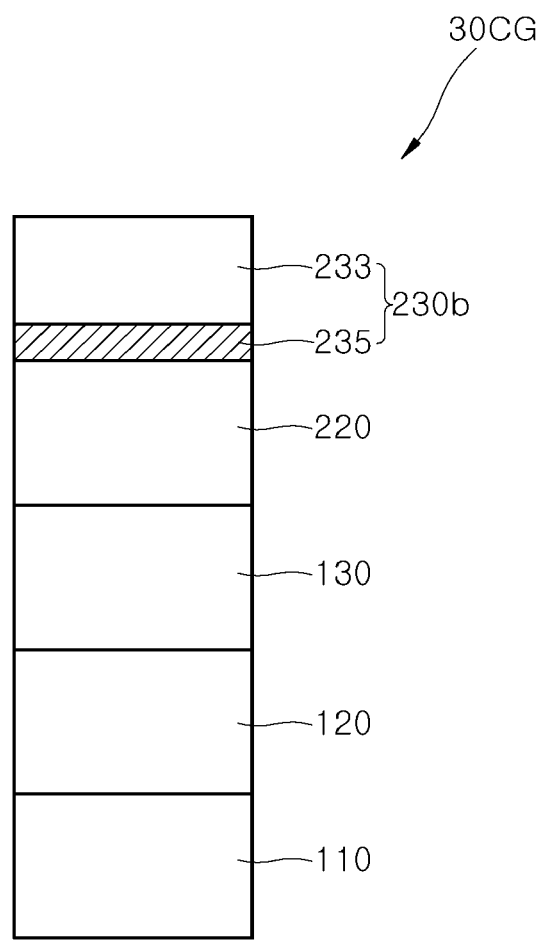

Referring to FIG. 12D, the pillar-shaped structure 30CG may include a first electrode 110, a resistance change material layer 120, a second electrode 130, a threshold switching operation layer 220, and a third electrode 230b. The third electrode 230b may include an electrode material layer 233 and a conductive fuse material layer 235. The conductive fuse material layer 235 may be disposed at an interface between the electrode material layer 233 and the threshold switching operation layer 220.

The conductive fuse material layer 235 may have substantially the same configuration and function as the conductive fuse material layer 115 of the pillar-shaped structure 30CD described above with reference to FIG. 12A.

In some other embodiments, unlike the embodiment illustrated in FIG. 12C, the electrode material layer 233 and the conductive fuse material layer 235 may be disposed so that the conductive fuse material layer 235 does not contact the threshold switching operation layer 220. More specifically, one surface of the electrode material layer 233 (e.g., a lower surface of the electrode material layer 233) may contact the threshold switching operation layer 220, and another surface of the electrode material layer 233 (e.g., an upper surface of the electrode material layer 233) may contact the conductive fuse material layer 235. The conductive fuse material layer 235 may contact the second conductive line 20 of FIG. 10 that is disposed above the third electrode 230b with respect to the orientation of FIG. 12D. Thus, the conductive fuse material layer 235 is disposed between the electrode material layer 233 and the second conductive line 20 of FIG. 10.

As described above, the pillar-shaped structures described with reference to FIGS. 10, 11A to 11C, and 12A to 12D may correspond to memory cells of a cross-point array device according to embodiments of the present disclosure. Accordingly, a conductive fuse material layer may be disposed in the memory cells. When an excessive current, which is equal to or greater than a threshold current, is provided to one of a plurality of memory cells in a cross-point array device, a conductive fuse material layer in the one memory cell can suppress the excessive current from passing through the one memory cell, thereby preventing an information error from occurring in other memory cells adjacent to the one memory cell during a read or write operation that is performed on the other memory cells.

Figure 13:
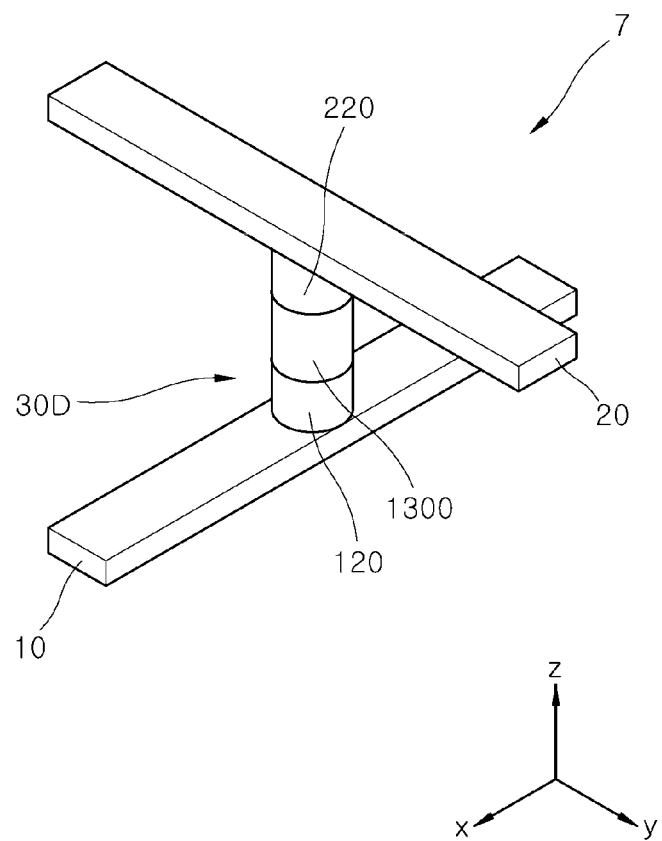
FIG. 13 is a perspective view schematically illustrating a cross-point array device according to an embodiment of the present disclosure.

FIG. 13 is a perspective view schematically illustrating a cross-point array device 7 according to an embodiment of the present disclosure. Referring to FIG. 13, the cross-point array device 7 may include a first conductive line 10 and a second conductive line 20, which intersect each other and are disposed on different planes. The cross-point array device 7 may further include a pillar-shaped structure 30D disposed in an intersection region where the first conductive line 10 overlaps the second conductive line 20. The pillar-shaped structure 30D may correspond to a memory cell of the cross-point array device 7.

The pillar-shaped structure 30D has a structure in which the first electrode 110 and the third electrode 230 in the pillar-shaped structure 30C of the embodiment described above with reference to FIG. 10 are omitted. Specifically, the pillar-shaped structure 30D may include a resistance change material layer 120, an intermediate electrode 1300, and a threshold switching operation layer 220. A lower surface of the resistance change material layer 120 may contact the first conductive line 10, and an upper surface of the threshold switching operation layer 220 may contact the second conductive line 20. The first and second conductive lines 10 and 20 may function as electrodes with respect to the resistance change material layer 120 and the threshold switching operation layer 220. A conductive fuse material layer may be disposed inside the pillar-shaped structure 30D, as described below.

FIGS. 14A to 14E are views schematically illustrating pillar-shaped structures 30DA, 30DB, 30DC, 30DD, and 30DE of FIG. 13 according to embodiments of the present disclosure.

Figure 14A:
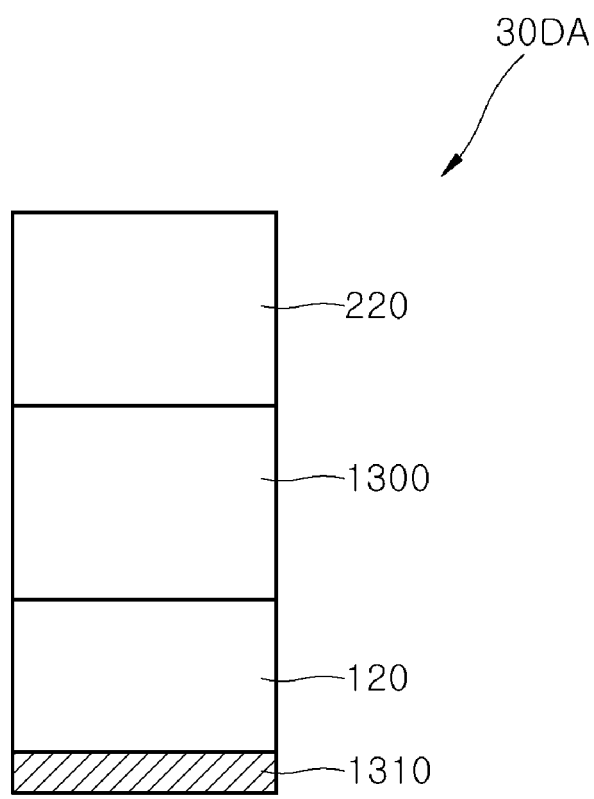
FIGS. 14A to 14E are views schematically illustrating pillar-shaped structures of the cross-point array device of FIG. 13 according to embodiments of the present disclosure.

Referring to FIG. 14A, the pillar-shaped structure 30DA includes a conductive fuse material layer 1310 that is disposed under a resistance change material layer 120 with respect to the orientation of FIG. 14A. The conductive fuse material layer 1310 may be disposed between the resistance change material layer 120 and the first conductive line 10 of FIG. 13.

Figure 14B:
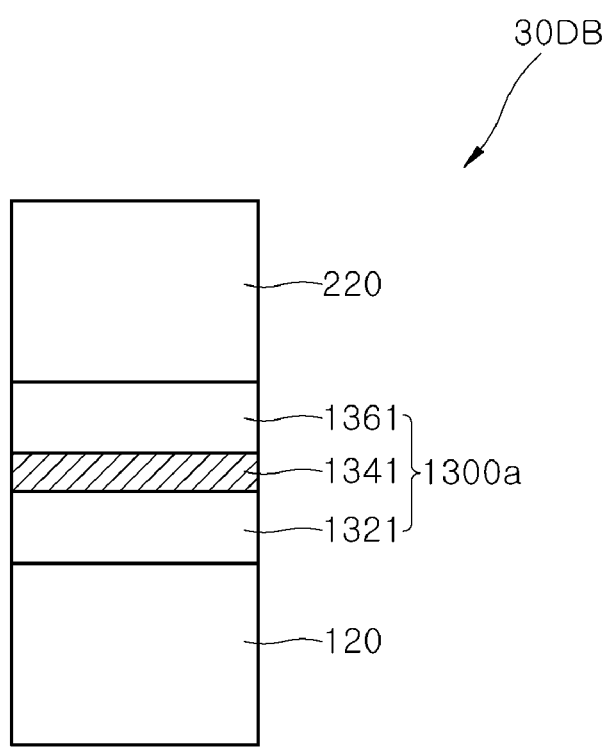

Referring to FIG. 14B, the pillar-shaped structure 30DB includes a conductive fuse material layer that is disposed inside an intermediate electrode 1300a. The intermediate electrode 1300a may include a first sub electrode layer 1321, the conductive fuse material layer 1341, and a second sub electrode layer 1361.

Figure 14C:
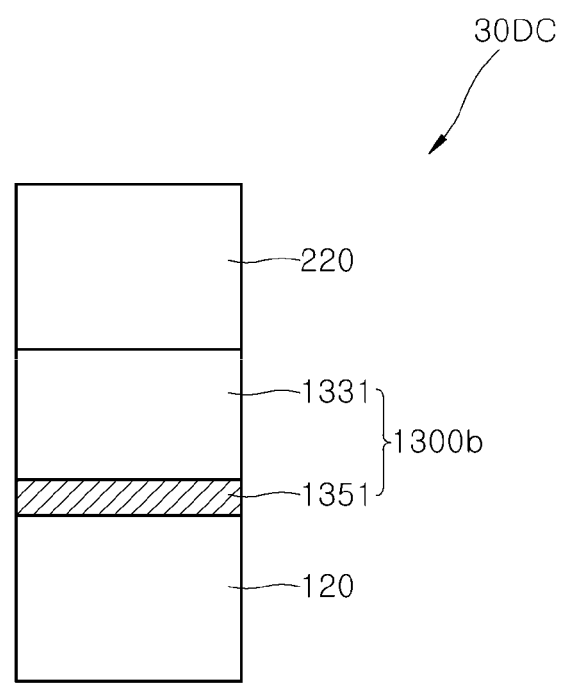

Referring to FIG. 14C, the pillar-shaped structure 30DC includes an intermediate electrode 1300b, which includes an electrode material layer 1331 and a conductive fuse material layer 1351. The conductive fuse material layer 1351 may contact a resistance change material layer 120. Thus, in this embodiment, the conductive fuse material layer 1351 is disposed between the resistance change material layer 120 and the electrode material layer 1331.

Figure 14D:
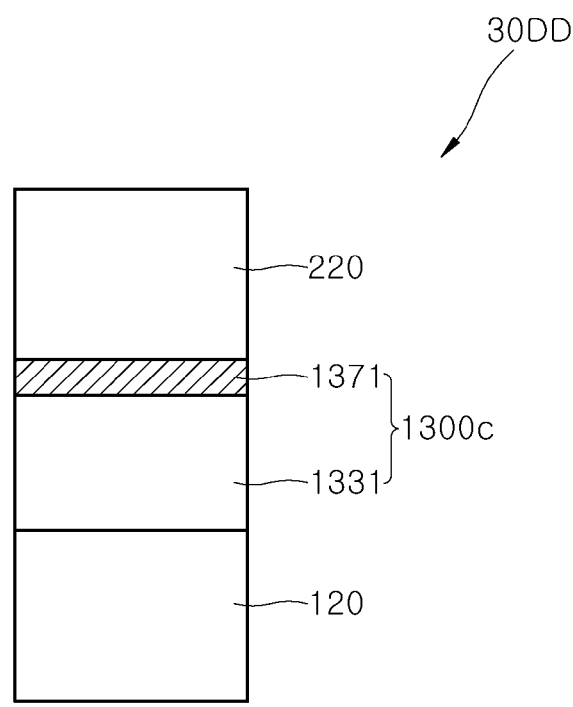

Referring to FIG. 14D, the pillar-shaped structure 30DD includes an intermediate electrode 1300c, which includes an electrode material layer 1331 and a conductive fuse material layer 1371. The conductive fuse material layer 1371 may contact a threshold switching operation layer 220. Thus, in this embodiment, the conductive fuse material layer 1371 is disposed between the electrode material layer 1331 and the threshold switching operation layer 220.

Figure 14E:
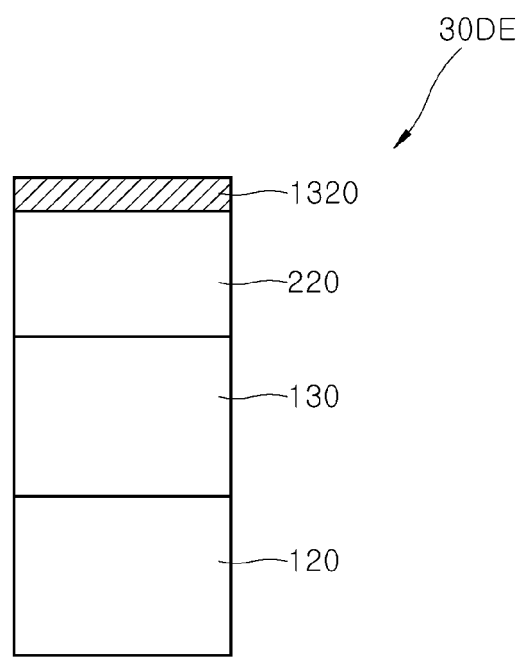

Referring to FIG. 14E, the pillar-shaped structure 30DE includes a conductive fuse material layer 1320 that is disposed on a threshold switching operation layer 220. The conductive fuse material layer 1310 may be disposed between the threshold switching operation layer 220 and the second conductive line 20 of FIG. 13.

Figure 15:
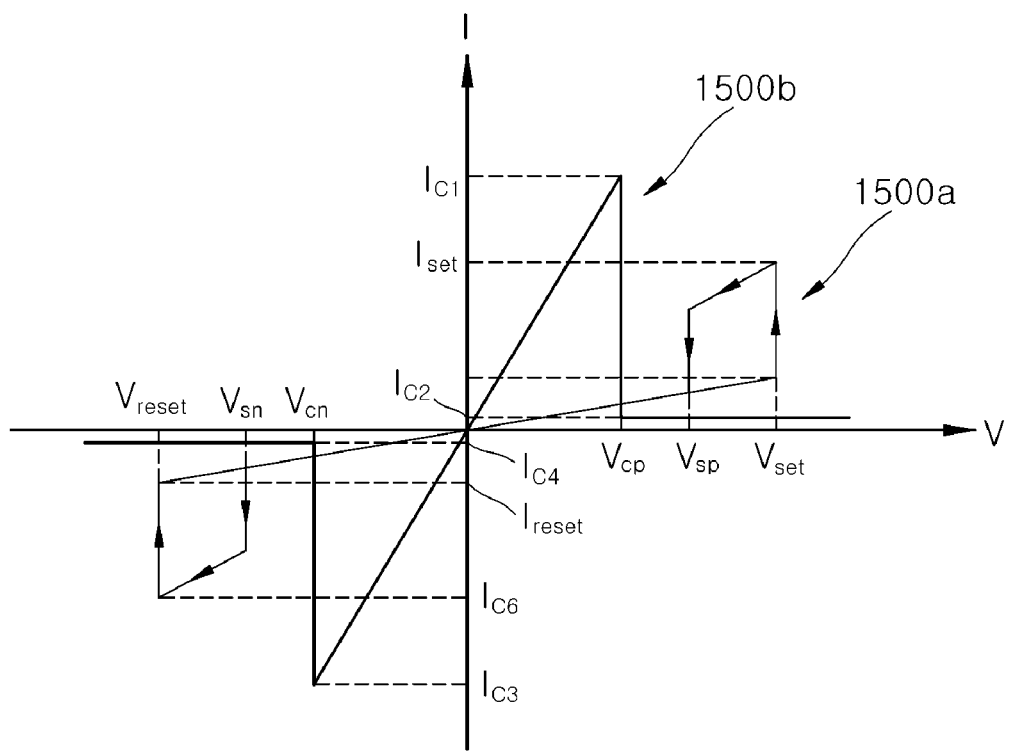
FIG. 15 is a graph schematically illustrating an operation of a memory cell according to an embodiment of the present disclosure.

FIG. 15 is a graph schematically illustrating an operation of a memory cell according to an embodiment of the present disclosure. The memory cell may correspond to any one of the pillar-shaped structures of the cross-point array devices described above with reference to FIGS. 10, 11A to 11C, 12A to 12D, 13, and 14A to 14E. Each of the pillar-shaped structures may include a resistance change material layer, a threshold switching operation layer, and at least one conductive fuse material layer.

Referring to FIG. 15, a first graph 1500a shows a current-voltage (I-V) characteristic of a normal memory cell, and a second graph 1500b shows a current-voltage (I-V) characteristic of an abnormal memory cell. A memory cell of a resistive memory (RRAM) device is used as an example of the above memory cell. However, the above memory cell is not necessarily limited to the memory cell of RRAM, and it may be applied to a PRAM device, an MRAM device, or an FRAM device. The abnormal memory cell may include a resistance change material layer that is electrically destroyed. The destruction of the resistance change material layer may proceed by an externally applied voltage or defects in the resistance change material layer.

Referring to the first graph 1500a of FIG. 15, when a voltage having a positive bias is applied to the normal memory cell, which is initially in a high resistance state, a relatively low operation current flows in the memory cell until the applied voltage reaches a switching voltage Vsp, and then reaches a set voltage Vset. The switching voltage Vsp is a voltage at which a selection element in the memory cell is turned on. When the applied voltage reaches the set voltage Vset, a set operation is performed on the memory cell, and thus the high resistance state of the memory cell is converted into a low resistance state. Accordingly, the operation current of the memory cell may greatly increase to a set current (Iset) level by the set operation. Subsequently, when the applied voltage decreases for the memory cell, which is in the low resistance state, the operation current may decrease according to the decreased applied voltage. When the applied voltage decreases to the switching voltage Vsp, the selection element in the memory cell may be turned off and thus the operation current may greatly decrease, relative to other operation current changes.

Meanwhile, when a voltage having a negative bias is applied to the memory cell, which is in the low resistance state, a relatively low operation current flows in the memory cell until the applied voltage reaches a switching voltage Vsn. When the applied voltage reaches the switching voltage Vsn, the selection element in the memory cell is turned on, and thus the operation current of the memory cell may greatly increase, relative to other operation current changes. Consequently, a relatively high operation current can flow in the memory cell until the applied voltage reaches a reset voltage Vreset. When the applied voltage reaches the reset voltage Vreset, a reset operation is performed on the memory cell, and thus the resistance state of the memory cell is converted from the low resistance state into the high resistance state. Accordingly, the operation current of the memory cell decreases to a reset current (Ireset) level by the reset operation. After that, when an absolute value of the applied voltage decreases for the memory cell that has been converted into the high resistance state by the reset operation, the operation current may further decrease. Meanwhile, when the absolute value of the applied voltage decreases to the switching voltage Vsn, the selection element may be turned off.

Referring to the second graph 1500b of FIG. 15, when a voltage having a positive bias is applied to the abnormal memory cell, an operation current flowing in the memory cell may greatly increase relative to other operation current changes. When the operation current reaches a threshold current $I_{C1}$, a conductive fuse material layer in the memory cell can suppress the current flowing in the memory cell. The threshold current $I_{C1}$ may be greater than a set current Iset corresponding to a low resistance signal of the memory cell.

As illustrated in FIG. 15, when the applied voltage reaches a threshold voltage Vcp, the current flowing in the memory cell may decrease from the threshold current $I_{C1}$ to a first insulating current $I_{C2}$. The first insulating current $I_{C2}$ may be a sufficiently low current at which the memory cell is electrically insulated. The threshold voltage Vcp may be less than a switching voltage Vsp or a set voltage Vset of the memory cell. As a result, the electrification phenomenon occurring in the abnormal memory cell, which includes a resistance change material layer that is electrically destroyed, can be prevented.

Similarly, when a voltage having a negative bias is applied to the abnormal memory cell in which the resistance change material layer is electrically destroyed, the operation current flowing in the memory cell may greatly increase relative to other operation current changes. When the operation current reaches a threshold current $I_{C3}$, the conductive fuse material layer in the memory cell can suppress the current flowing in the memory cell. The threshold current $I_{C3}$ may have an absolute value greater than an absolute value of an allowed operation current $I_{C6}$ when a voltage is applied with a negative bias to the normal memory cell.

As illustrated, when the applied voltage reaches a threshold voltage Vcn, an absolute value of the current flowing in the abnormal memory cell may decrease from the threshold current $I_{C3}$ to a second insulating current $I_{C4}$. The second insulating current $I_{C4}$ may be a sufficiently low current at which the memory cell is electrically insulated. The threshold voltage Vcn may be less than the reset voltage Vreset of the memory cell. As a result, the electrification phenomenon occurring in the abnormal memory cell, which includes the resistance change material layer that is electrically destroyed, can be prevented.

The embodiments of the present disclosure have been described above for illustrative purposes. Those of ordinary skill in the art will appreciate that various modifications, additions, and substitutions are possible, without departing from the scope and spirit of the present disclosure as disclosed in the accompanying claims.

What is claimed is:
1. A cross-point array device, comprising:
a pillar-shaped structure disposed in an intersection region where a first conductive line overlaps a second conductive line,
wherein the pillar-shaped structure comprises:
a resistance change material layer disposed between the first conductive line and the second conductive line; and
one or more conductive fuse material layers, each of which is disposed between the first or second conductive line and the resistance change material layer,
wherein a melting point of the conductive fuse material layer is higher than a melting point of the resistance change material layer,
wherein the resistance change material layer and the conductive fuse material layer each include a chalcogenide material, and
wherein the conductive fuse material layer maintains a low resistance state within a first current range in which the resistance change material layer undergoes resistance change between the low resistance state and a high resistance state, and the conductive fuse material layer turns to the high resistance state at a second current range that is higher than the first current range.
2. The cross-point array device of claim 1,
wherein the pillar-shaped structure further comprises a threshold switching operation layer that is disposed above or below the resistance change material layer.
3. The cross-point array device of claim 1,
wherein the resistance change material layer comprises any one selected from a transition metal oxide material, a perovskite-based material, a ferroelectric material, and a ferromagnetic material.

4. The cross-point array device of claim 1, further comprising:
a first electrode; and
a second electrode,
wherein the first electrode and the second electrode are disposed below and over the resistance change material layer, respectively, and
wherein each of the one or more conductive fuse material layers is disposed inside the first electrode or the second electrode.

5. The cross-point array device of claim 1,
wherein the one or more conductive fuse material layers contact the resistance change material layer.

6. The cross-point array device of claim 1,
wherein, the one or more conductive fuse material layers suppress an excessive current from passing through the pillar-shaped structure when the excessive current is provided to the one or more conductive fuse material layers, the excessive current being equal to or greater than a predetermined threshold current.

7. The cross-point array device of claim 6,
wherein the predetermined threshold current is greater than an operation current that passes through the resistance change material layer when the resistance change material layer is in a low resistance state.

8. The cross-point array device of claim 6,
wherein, when the excessive current is provided to the one or more conductive fuse material layers, a resistance state of the one or more conductive fuse material layers changes from a low resistance state to a high resistance state.

9. The cross-point array device of claim 8,
wherein the one or more conductive fuse material layers comprise a phase change material, the phase change material changing from a crystalline state to an amorphous state by the excessive current.

10. The cross-point array device of claim 1,
wherein the one or more conductive fuse material layers comprise a material, the material having a melting point that is lower than a melting point of an electrode layer in contact with the one or more conductive fuse material layers.

11. A cross-point array device, comprising:
a plurality of first conductive lines extending in a first direction;
a plurality of second conductive lines extending in a second direction that crosses the first direction;
a plurality of memory cells disposed in intersection regions where the first conductive lines overlap the second conductive lines, each of the plurality of memory cells including a resistance change material layer; and
one or more conductive fuse material layers disposed adjacent to the resistance change material layer in each of the plurality of memory cells,
wherein a melting point of the conductive fuse material layer is higher than a melting point of the resistance change material layer,
wherein the resistance change material layer and the conductive fuse material layer each include a chalcogenide material, and
wherein the conductive fuse material layer maintains a low resistance state within a first current range in which the resistance change material layer undergoes resistance change between the low resistance state and a high resistance state, and the conductive fuse material layer turns to the high resistance state at a second current range that is higher than the first current range.

12. The cross-point array device of claim 11,
wherein, when an excessive current is provided to one of the plurality of memory cells, one or more conductive fuse material layers suppress the excessive current from passing through the one memory cell to prevent an information error from occurring during a read operation or a write operation for a memory cell adjacent to the one memory cell, the excessive current being equal to or greater than a threshold current, the one or more conductive fuse material layers being disposed in the one memory cell, and
wherein the threshold current is greater than an operation current corresponding to a low resistance signal stored in the one memory cell.

13. The cross-point array device of claim 11,
wherein each of the plurality of memory cells comprises a pillar-shaped structure including a first electrode, the resistance change material layer, and a second electrode, and
wherein one or both of the first electrode and the second electrode comprises the one or more conductive fuse material layers, each of the one or more conductive fuse material layers being included in each of the one or both of the first electrode and the second electrode.

14. The cross-point array device of claim 13,
wherein the one or more conductive fuse material layers are disposed inside at least one of the first electrode and the second electrode.

15. The cross-point array device of claim 13,
wherein the one or more conductive fuse material layers contact the resistance change material layer.

16. The cross-point array device of claim 11,
wherein each of the plurality of memory cells comprises a pillar-shaped structure including the resistance change material layer, and
wherein each of the one or more conductive fuse material layers is disposed between one of the first conductive lines or one of the second conductive lines and the resistance change material layer.

17. The cross-point array device of claim 11,
wherein each of the plurality of memory cells comprises a pillar-shaped structure including a first electrode, the resistance change material layer, a second electrode, a threshold switching operation layer, and a third electrode, and
wherein at least one of the first to third electrodes comprises the one or more conductive fuse material layers.

18. The cross-point array device of claim 17,
wherein each of the one or more conductive fuse material layers is disposed inside each of the at least one of the first to third electrodes.

19. The cross-point array device of claim 17,
wherein each of the one or more conductive fuse material layers is disposed at each of at least one of a first interface between the first electrode and the resistance change material layer, a second interface between the resistance change material layer and the second electrode, a third interface between the second electrode and the threshold switching operation layer, and a fourth interface between the threshold switching operation layer and the third electrode.

* * * * *